United States Patent
Sulimarski et al.

(10) Patent No.: US 9,935,590 B2
(45) Date of Patent: *Apr. 3, 2018

(54) MIXER IMPAIRMENT CORRECTION BASED ON VOLTERRA SERIES

(71) Applicant: Intel IP Corporation, Santa Clara, CA (US)

(72) Inventors: Avi Sulimarski, Kfar Oranim (IL); Itay Almog, Ganey Tikva (IL); Michael Kerner, Tel Mond (IL)

(73) Assignee: Intel IP Corporation, Santa Clara, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/256,718

(22) Filed: Sep. 5, 2016

(65) Prior Publication Data

US 2017/0063312 A1    Mar. 2, 2017

Related U.S. Application Data

(63) Continuation of application No. 14/843,174, filed on Sep. 2, 2015, now Pat. No. 9,438,178.

(51) Int. Cl.
*H03H 7/30*    (2006.01)
*H03H 7/40*    (2006.01)
(Continued)

(52) U.S. Cl.
CPC ......... *H03F 1/3258* (2013.01); *H03F 1/3282* (2013.01); *H03F 3/19* (2013.01);
(Continued)

(58) Field of Classification Search
CPC . H03F 1/3258; H03F 3/19; H03F 3/21; H03F 2200/336; H03F 2200/451;
(Continued)

(56) References Cited

U.S. PATENT DOCUMENTS 5,789,927 A * 8/1998 Belcher .................. G01R 23/20
324/620
8,577,311 B2   11/2013 Wolf
(Continued)

OTHER PUBLICATIONS

Collados, Manel et al., "A Low-Current Digitally Predistorted Direct-Conversion Transmitter with 25% Duty-Cycle Passive Mixer." IEEE Transactions on Microwave Theory and Techniques, vol. 62, No. 4, Apr. 2014, pp. 726-731.
(Continued)

*Primary Examiner* — Phuong Phu
(74) *Attorney, Agent, or Firm* — Eschweiler & Potashnik, LLC

(57) ABSTRACT

Techniques for compensating for signal impairments introduced by a mixer are discussed. One example system employing such techniques can include mixer predistortion circuitry configured to receive signal in-phase (I) and signal quadrature (Q) components of a signal and to generate a mixer predistortion signal based at least in part on the signal I and Q components, wherein the mixer predistortion signal compensates for nonlinearities caused by a mixer that upconverts the signal. Optionally, imbalance correction circuitry to compensate for gain and phase imbalance and/or skew correction circuitry to compensate for gain and phase skew can also be included.

18 Claims, 14 Drawing Sheets

(51) Int. Cl.
  *H03K 5/159* (2006.01)
  *H03F 1/32* (2006.01)
  *H03F 3/19* (2006.01)
  *H03F 3/24* (2006.01)
  *H03F 3/21* (2006.01)
  *H04B 1/04* (2006.01)

(52) U.S. Cl.
  CPC ............. *H03F 3/21* (2013.01); *H03F 3/245* (2013.01); *H03F 2200/336* (2013.01); *H03F 2200/451* (2013.01); *H03F 2201/3224* (2013.01); *H04B 2001/0425* (2013.01)

(58) Field of Classification Search
  CPC .......... H03F 2201/3224; H03F 1/3282; H03F 3/245; H04L 27/01; H04B 1/44; H04B 2001/0425
  USPC ................................. 375/235, 296, 297, 298
  See application file for complete search history.

(56) References Cited

U.S. PATENT DOCUMENTS

| | | | |
|---|---|---|---|
| 9,438,178 B1* | 9/2016 | Sulimarski | H03F 3/19 |
| 2006/0008030 A1 | 1/2006 | Luke | |
| 2007/0237260 A1 | 10/2007 | Hori | |
| 2010/0102895 A1* | 4/2010 | Beukema | H04L 27/0008 332/103 |
| 2010/0135449 A1 | 6/2010 | Row | |
| 2010/0225409 A1* | 9/2010 | Gossmann | H03C 1/36 332/146 |
| 2014/0254644 A1* | 9/2014 | Gotman | H04L 27/01 375/222 |
| 2016/0323010 A1* | 11/2016 | Wu | H04B 1/44 |

OTHER PUBLICATIONS

Non Final Office Action dated Mar. 30, 2016, U.S. Appl. No. 14/843,174.

Notice of Allowance dated May 11, 2016, U.S. Appl. No. 14/843,174.

Collados, Manel et al. "A Low-Current Digitally Predistorted Direct-Conversion Transmiter with 25% Duty-Cycle Passive Mixer." IEEE Transactions on Microwave Theory and Techniques, vol. 62, No. 4, Apr. 2014, pp. 726-731.

* cited by examiner

Example UE

MIXER IMPAIRMENT CORRECTION BASED ON VOLTERRA SERIES

CROSS-REFERENCE TO RELATED APPLICATIONS

The present patent application is a continuation application claiming priority from U.S. patent application Ser. No. 14/843,174, filed Sep. 2, 2015, and titled: "Mixer Impairment Correction Based on Volterra Series", which is incorporated herein by reference in its entirety.

FIELD

The present disclosure relates to wireless technology, and more specifically to techniques to compensate for impairments introduced to a signal by a mixer.

BACKGROUND

Signal mixing (for example, for upconverting a baseband signal to a radio frequency (RF) signal), whether by passive or active mixers, can cause multiple impairments of the signal, such as nonlinearities, memory effects, in-phase (I) and quadrature (Q) gain and phase imbalance, and skew imbalance. However, active mixers are a critical building block of RF front-ends. With a higher conversion gain, the active mixer provides a better noise suppression of the subsequent stages than passive mixers. Unfortunately, the CMOS active mixer suffers from more nonlinearity than a passive mixer.

DETAILED DESCRIPTION

Figure 1:
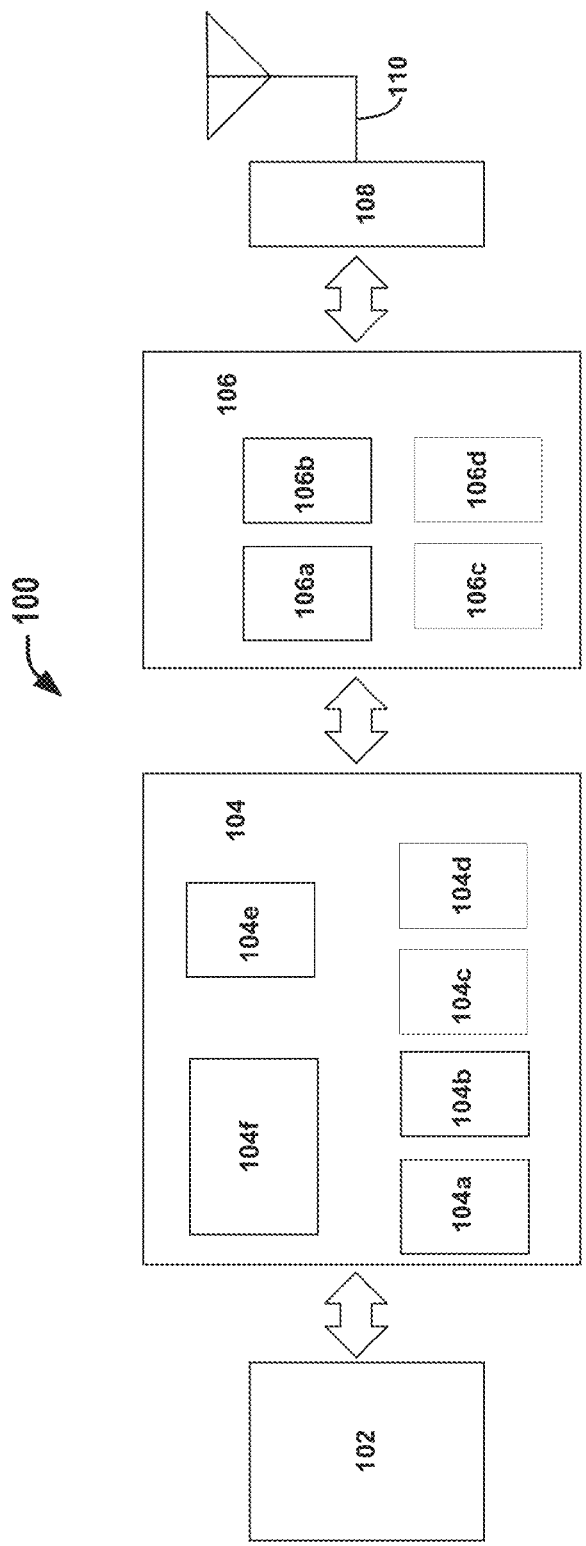
FIG. 1 is a block diagram illustrating an example user equipment (UE) useable in connection with various aspects described herein.

The present disclosure will now be described with reference to the attached drawing figures, wherein like reference numerals are used to refer to like elements throughout, and wherein the illustrated structures and devices are not necessarily drawn to scale. As utilized herein, terms "component," "system," "interface," and the like are intended to refer to a computer-related entity, hardware, software (e.g., in execution), and/or firmware. For example, a component can be a processor (e.g., a microprocessor, a controller, or other processing device), a process running on a processor, a controller, an object, an executable, a program, a storage device, a computer, a tablet PC and/or a user equipment (e.g., mobile phone, etc.) with a processing device. By way of illustration, an application running on a server and the server can also be a component. One or more components can reside within a process, and a component can be localized on one computer and/or distributed between two or more computers. A set of elements or a set of other components can be described herein, in which the term "set" can be interpreted as "one or more."

Further, these components can execute from various computer readable storage media having various data structures stored thereon such as with a module, for example. The components can communicate via local and/or remote processes such as in accordance with a signal having one or more data packets (e.g., data from one component interacting with another component in a local system, distributed system, and/or across a network, such as, the Internet, a local area network, a wide area network, or similar network with other systems via the signal).

As another example, a component can be an apparatus with specific functionality provided by mechanical parts operated by electric or electronic circuitry, in which the electric or electronic circuitry can be operated by a software application or a firmware application executed by one or more processors. The one or more processors can be internal or external to the apparatus and can execute at least a part of the software or firmware application. As yet another example, a component can be an apparatus that provides specific functionality through electronic components without mechanical parts; the electronic components can include one or more processors therein to execute software and/or firmware that confer(s), at least in part, the functionality of the electronic components.

Use of the word exemplary is intended to present concepts in a concrete fashion. As used in this application, the term "or" is intended to mean an inclusive "or" rather than an exclusive "or". That is, unless specified otherwise, or clear from context, "X employs A or B" is intended to mean any of the natural inclusive permutations. That is, if X employs A; X employs B; or X employs both A and B, then "X employs A or B" is satisfied under any of the foregoing instances. In addition, the articles "a" and "an" as used in this application and the appended claims should generally be construed to mean "one or more" unless specified otherwise or clear from context to be directed to a singular form. Furthermore, to the extent that the terms "including", "includes", "having", "has", "with", or variants thereof are used in either the detailed description and the claims, such terms are intended to be inclusive in a manner similar to the term "comprising."

As used herein, the term "circuitry" may refer to, be part of, or include an Application Specific Integrated Circuit) ASIC (an electronic circuit, a processor (shared, dedicated, or group (and/or memory) shared, dedicated, or group (that execute one or more software or firmware programs, a combinational logic circuit, and/or other suitable hardware components that provide the described functionality. In some embodiments, the circuitry may be implemented in, or functions associated with the circuitry may be implemented by, one or more software or firmware modules. In some embodiments, circuitry may include logic, at least partially operable in hardware.

As used herein, the term "circuitry" may refer to, be part of, or include an Application Specific Integrated Circuit (ASIC), an electronic circuit, a processor (shared, dedicated, or group), and/or memory (shared, dedicated, or group) that execute one or more software or firmware programs, a combinational logic circuit, and/or other suitable hardware components that provide the described functionality. In some embodiments, the circuitry may be implemented in, or functions associated with the circuitry may be implemented by, one or more software or firmware modules. In some embodiments, circuitry may include logic, at least partially operable in hardware.

Embodiments described herein may be implemented into a system using any suitably configured hardware and/or software. FIG. 1 illustrates, for one embodiment, example components of a User Equipment (UE) device 100. In some embodiments, the UE device 100 may include application circuitry 102, baseband circuitry 104, Radio Frequency (RF) circuitry 106, front-end module (FEM) circuitry 108 and one or more antennas 110, coupled together at least as shown.

The application circuitry 102 may include one or more application processors. For example, the application circuitry 102 may include circuitry such as, but not limited to, one or more single-core or multi-core processors. The processor(s) may include any combination of general-purpose processors and dedicated processors (e.g., graphics processors, application processors, etc.). The processors may be coupled with and/or may include memory/storage and may be configured to execute instructions stored in the memory/storage to enable various applications and/or operating systems to run on the system.

The baseband circuitry 104 may include circuitry such as, but not limited to, one or more single-core or multi-core processors. The baseband circuitry 104 may include one or more baseband processors and/or control logic to process baseband signals received from a receive signal path of the RF circuitry 106 and to generate baseband signals for a transmit signal path of the RF circuitry 106. Baseband processing circuitry 104 may interface with the application circuitry 102 for generation and processing of the baseband signals and for controlling operations of the RF circuitry 106. For example, in some embodiments, the baseband circuitry 104 may include a second generation (2G) baseband processor 104a, third generation (3G) baseband processor 104b, fourth generation (4G) baseband processor 104c, and/or other baseband processor(s) 104d for other existing generations, generations in development or to be developed in the future (e.g., fifth generation (5G), 6G, etc.). The baseband circuitry 104 (e.g., one or more of baseband processors 104a-d) may handle various radio control functions that enable communication with one or more radio networks via the RF circuitry 106. The radio control functions may include, but are not limited to, signal modulation/demodulation, encoding/decoding, radio frequency shifting, etc. In some embodiments, modulation/demodulation circuitry of the baseband circuitry 104 may include Fast-Fourier Transform (FFT), preceding, and/or constellation mapping/demapping functionality. In some embodiments, encoding/decoding circuitry of the baseband circuitry 104 may include convolution, tail-biting convolution, turbo, Viterbi, and/or Low Density Parity Check (LDPC) encoder/decoder functionality. Embodiments of modulation/demodulation and encoder/decoder functionality are not limited to these examples and may include other suitable functionality in other embodiments.

In some embodiments, the baseband circuitry 104 may include elements of a protocol stack such as, for example, elements of an evolved universal terrestrial radio access network (EUTRAN) protocol including, for example, physical (PHY), media access control (MAC), radio link control (RLC), packet data convergence protocol (PDCP), and/or radio resource control (RRC) elements. A central processing unit (CPU) 104e of the baseband circuitry 104 may be configured to run elements of the protocol stack for signaling of the PHY, MAC, RLC, PDCP and/or RRC layers. In some embodiments, the baseband circuitry may include one or more audio digital signal processor(s) (DSP) 104f. The audio DSP(s) 104f may be include elements for compression/decompression and echo cancellation and may include other suitable processing elements in other embodiments. Components of the baseband circuitry may be suitably combined in a single chip, a single chipset, or disposed on a same circuit board in some embodiments. In some embodiments, some or all of the constituent components of the baseband circuitry 104 and the application circuitry 102 may be implemented together such as, for example, on a system on a chip (SOC).

In some embodiments, the baseband circuitry 104 may provide for communication compatible with one or more radio technologies. For example, in some embodiments, the baseband circuitry 104 may support communication with an evolved universal terrestrial radio access network (EUTRAN) and/or other wireless metropolitan area networks (WMAN), a wireless local area network (WLAN), a wireless personal area network (WPAN). Embodiments in which the baseband circuitry 104 is configured to support radio communications of more than one wireless protocol may be referred to as multi-mode baseband circuitry.

RF circuitry 106 may enable communication with wireless networks using modulated electromagnetic radiation through a non-solid medium. In various embodiments, the RF circuitry 106 may include switches, filters, amplifiers, etc. to facilitate the communication with the wireless network. RF circuitry 106 may include a receive signal path which may include circuitry to down-convert RF signals received from the FEM circuitry 108 and provide baseband signals to the baseband circuitry 104. RF circuitry 106 may also include a transmit signal path which may include circuitry to up-convert baseband signals provided by the baseband circuitry 104 and provide RF output signals to the FEM circuitry 108 for transmission.

In some embodiments, the RF circuitry 106 may include a receive signal path and a transmit signal path. The receive signal path of the RF circuitry 106 may include mixer circuitry 106a, amplifier circuitry 106b and filter circuitry 106c. The transmit signal path of the RF circuitry 106 may include filter circuitry 106c and mixer circuitry 106a. RF circuitry 106 may also include synthesizer circuitry 106d for synthesizing a frequency for use by the mixer circuitry 106a of the receive signal path and the transmit signal path. In some embodiments, the mixer circuitry 106a of the receive signal path may be configured to down-convert RF signals received from the FEM circuitry 108 based on the synthesized frequency provided by synthesizer circuitry 106d. The amplifier circuitry 106b may be configured to amplify the down-converted signals and the filter circuitry 106c may be a low-pass filter (LPF) or band-pass filter (BPF) configured to remove unwanted signals from the down-converted signals to generate output baseband signals. Output baseband signals may be provided to the baseband circuitry 104 for further processing. In some embodiments, the output baseband signals may be zero-frequency baseband signals, although this is not a requirement. In some embodiments, mixer circuitry 106a of the receive signal path may comprise passive mixers, although the scope of the embodiments is not limited in this respect.

In some embodiments, the mixer circuitry 106a of the transmit signal path may be configured to up-convert input baseband signals based on the synthesized frequency provided by the synthesizer circuitry 106d to generate RF output signals for the FEM circuitry 108. The baseband signals may be provided by the baseband circuitry 104 and may be filtered by filter circuitry 106c. The filter circuitry 106c may include a low-pass filter (LPF), although the scope of the embodiments is not limited in this respect.

In some embodiments, the mixer circuitry 106a of the receive signal path and the mixer circuitry 106a of the transmit signal path may include two or more mixers and may be arranged for quadrature downconversion and/or upconversion respectively. In some embodiments, the mixer circuitry 106a of the receive signal path and the mixer circuitry 106a of the transmit signal path may include two or more mixers and may be arranged for image rejection (e.g., Hartley image rejection). In some embodiments, the mixer circuitry 106a of the receive signal path and the mixer circuitry 106a may be arranged for direct downconversion and/or direct upconversion, respectively. In some embodiments, the mixer circuitry 106a of the receive signal path and the mixer circuitry 106a of the transmit signal path may be configured for super-heterodyne operation.

In some embodiments, the output baseband signals and the input baseband signals may be analog baseband signals, although the scope of the embodiments is not limited in this respect. In some alternate embodiments, the output baseband signals and the input baseband signals may be digital baseband signals. In these alternate embodiments, the RF circuitry 106 may include analog-to-digital converter (ADC) and digital-to-analog converter (DAC) circuitry and the baseband circuitry 104 may include a digital baseband interface to communicate with the RF circuitry 106.

In some dual-mode embodiments, a separate radio IC circuitry may be provided for processing signals for each spectrum, although the scope of the embodiments is not limited in this respect.

In some embodiments, the synthesizer circuitry 106d may be a fractional-N synthesizer or a fractional N/N+1 synthesizer, although the scope of the embodiments is not limited in this respect as other types of frequency synthesizers may be suitable. For example, synthesizer circuitry 106d may be a delta-sigma synthesizer, a frequency multiplier, or a synthesizer comprising a phase-locked loop with a frequency divider.

The synthesizer circuitry 106d may be configured to synthesize an output frequency for use by the mixer circuitry 106a of the RF circuitry 106 based on a frequency input and a divider control input. In some embodiments, the synthesizer circuitry 106d may be a fractional N/N+1 synthesizer.

In some embodiments, frequency input may be provided by a voltage controlled oscillator (VCO), although that is not a requirement. Divider control input may be provided by either the baseband circuitry 104 or the applications processor 102 depending on the desired output frequency. In some embodiments, a divider control input (e.g., N) may be determined from a look-up table based on a channel indicated by the applications processor 102.

Synthesizer circuitry 106d of the RF circuitry 106 may include a divider, a delay-locked loop (DLL), a multiplexer and a phase accumulator. In some embodiments, the divider may be a dual modulus divider (DMD) and the phase accumulator may be a digital phase accumulator (DPA). In some embodiments, the DMD may be configured to divide the input signal by either N or N+1 (e.g., based on a carry out) to provide a fractional division ratio. In some example embodiments, the DLL may include a set of cascaded, tunable, delay elements, a phase detector, a charge pump and a D-type flip-flop. In these embodiments, the delay elements may be configured to break a VCO period up into Nd equal packets of phase, where Nd is the number of delay elements in the delay line. In this way, the DLL provides negative feedback to help ensure that the total delay through the delay line is one VCO cycle.

In some embodiments, synthesizer circuitry 106d may be configured to generate a carrier frequency as the output frequency, while in other embodiments, the output frequency may be a multiple of the carrier frequency (e.g., twice the carrier frequency, four times the carrier frequency) and used in conjunction with quadrature generator and divider circuitry to generate multiple signals at the carrier frequency with multiple different phases with respect to each other. In some embodiments, the output frequency may be a LO frequency (fLO). In some embodiments, the RF circuitry 106 may include an IQ/polar converter.

FEM circuitry 108 may include a receive signal path which may include circuitry configured to operate on RF signals received from one or more antennas 110, amplify the received signals and provide the amplified versions of the received signals to the RF circuitry 106 for further processing. FEM circuitry 108 may also include a transmit signal path which may include circuitry configured to amplify signals for transmission provided by the RF circuitry 106 for transmission by one or more of the one or more antennas 110.

In some embodiments, the FEM circuitry 108 may include a TX/RX switch to switch between transmit mode and receive mode operation. The FEM circuitry may include a receive signal path and a transmit signal path. The receive signal path of the FEM circuitry may include a low-noise amplifier (LNA) to amplify received RF signals and provide the amplified received RF signals as an output (e.g., to the RF circuitry 106). The transmit signal path of the FEM circuitry 108 may include a power amplifier (PA) to amplify input RF signals (e.g., provided by RF circuitry 106), and one or more filters to generate RF signals for subsequent transmission (e.g., by one or more of the one or more antennas 110.

In some embodiments, the UE device 100 may include additional elements such as, for example, memory/storage, display, camera, sensor, and/or input/output (I/O) interface.

Embodiments discussed herein can employ novel techniques to estimate and digitally compensate for signal impairments introduced by a mixer, such as nonlinearities, memory effects, in-phase (I) and quadrature (Q) gain and phase imbalance, and skew imbalance. Mixers, both passive and active, can cause various impairments in mixed signals. Conventionally, these impairments have either gone unaddressed, or minimized via design, but at a cost in terms of power consumption.

In aspects described herein, mathematical models based on a Volterra series can be employed to eliminate mixer signal impairments such as nonlinearities, memory effects, IQ gain and phase imbalance, and skew imbalance. Signal measurements obtained via an observation path can be employed to determine coefficients to compensate for mixer impairments for specific operating conditions.

In various embodiments, correction of mixer signal impairments can be based on a model that employs separate coefficients for I and Q components of the signal, and for cross terms between the I and Q components. Various embodiments can employ a model and associated techniques discussed herein to estimate various signal impairments introduced by mixers, such as nonlinearities, memory effects, gain and phase imbalance, and skew imbalance.

Embodiments discussed herein can be employed in connection with a transmitter of a wireless communications device, such as a user equipment (UE), Evolved NodeB (eNB), etc., and can generate signals that can compensate for mixer impairments, which can be determined based at least in part on operational packets and signals received via an observation path (e.g., via a feedback receiver, etc.). Although certain example embodiments illustrated and discussed herein employ dedicated hardware, in other embodiments, some or all of the functions of the circuitry shown in connection with example embodiments may be implemented via software or firmware executed by one or more processors, etc.

Figure 2:
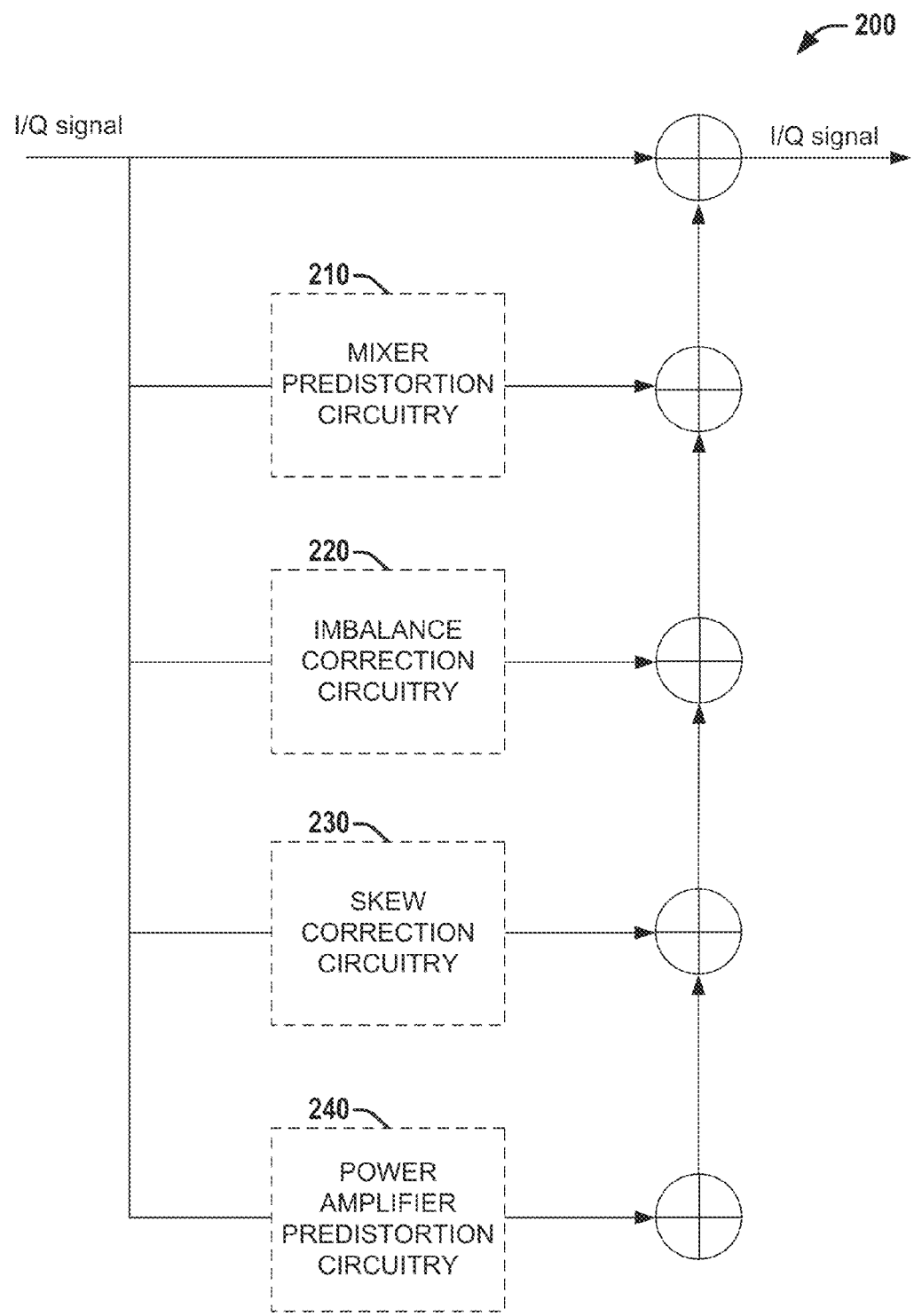
FIG. 2 is a block diagram illustrating an example system that facilitates compensation for signal impairments introduced by a mixer, according to various aspects described herein.

Referring to FIG. 2, illustrated is a block diagram of an example system 200 that facilitates compensation for signal impairments introduced by a mixer, according to various aspects described herein. System 200 can be employed in connection with an active or passive mixer, such as, for example, in or in connection with a transmitter that upconverts a baseband (BB) signal to a radio frequency (RF) signal via a mixer for subsequent transmission. In various embodiments, system 200 can include at least one of mixer predistortion circuitry 210, imbalance correction circuitry 220, and skew correction circuitry 230, and can include power amplifier (PA) predistortion circuitry 240.

Mixer predistortion circuitry 210 can receive in-phase (I) and quadrature (Q) components of a signal that can also be provided to a mixer (e.g., for upconversion, etc.). Based on these signal I and Q components and the model and techniques discussed in greater detail below, mixer predistortion circuitry 210 can generate a mixer predistortion signal that can compensate for nonlinearities (and memory effects) caused by the mixer, by predistorting the signal such that when the mixer introduces nonlinearities into the predistorted signal, the resulting signal is free of the nonlinearities. In connection with one example embodiment described in greater detail below, the mixer output can be modeled (with a third order approximation) as $x(t)+\alpha \cdot 3 \cdot \beta \cdot \bar{x}(t)^3 + \alpha \cdot 3 \cdot (1+2 \cdot \beta^2) \cdot |x(t)|^2 \cdot x(t)$, where $x(t)$ is the signal input to the mixer, $\alpha$ is the complex nonlinear gain of the mixer, and $\beta$ is the attenuation of the third harmonic of the mixer. In such embodiments, mixer predistortion circuitry 210 can correct for the $\alpha \cdot 3 \cdot \beta \cdot \bar{x}(t)^3$ term, which involves the unwanted artifacts $I^3$, $Q^3$, $I^2*Q$, and $Q^2*I$.

In some embodiments, mixer predistortion circuitry can also receive one or more time-delayed I components of the signal, and one or more time-delayed Q components of the signal. In these embodiments, the mixer predistortion signal can additionally compensate for memory effects introduced by the mixer.

As explained further below, the mixer predistortion signal (and other predistortion and correction signals generated by various circuitry) can be based on models detailed herein that can be derived from a Volterra series approximation (e.g., a truncated Volterra series). Depending on the embodiment, more or less terms can be included, including potentially more higher-order terms, more terms with increasing memory depth, or a combination of the two. In various embodiments, different polynomial approximations in the signal I and Q components (and optionally one or more time-delayed I and Q components) can be employed in different embodiments, where the coefficients of the polynomial can be determined based at least in part on the signal I and Q components, and signals received via an observation path (e.g., via a feedback receiver, etc.), such as via a least-squares or other approximation technique to model the nonlinearities and/or memory effects. In various embodiments, by including higher-order terms (e.g., third order, third and fifth order, etc.), nonlinear effects can be compensated for to various degrees of precision. In the same or other embodiments, by including one or more time-delayed I components and one or more time-delayed Q components, memory effects can also be compensated for to various degrees. Where both higher-order terms and increased memory depth are included, at least some of the higher-order terms can involve higher powers (e.g., third, third and fifth, etc.) of time-delayed I and Q components.

Imbalance correction circuitry 220 can receive I and Q components of the signal that can also be provided to the mixer, and based on the signal I and Q components (and the model and techniques discussed in greater detail below), can generate an imbalance correction signal that can compensate for gain and phase imbalance caused by the mixer (as with mixer predistortion component 210, this can be done by predistorting the signal to compensate for gain and phase imbalance). The imbalance correction signal can include I and Q components (e.g., an imbalance correction I component and an imbalance correction Q component), each of which can be based on a linear combination (e.g., based on real coefficients) of the signal I and Q components. As with the mixer predistortion signal discussed above, the coefficients of the imbalance correction signal can also be determined based at least in part on the signal I and Q components, and signals received via an observation path (e.g., via a feedback receiver, etc.), such as via a least-squares or other approximation technique to model the gain and phase imbalance.

Skew correction circuitry 230 can receive the signal I and Q components (and optionally at least one time-delayed I component of the signal and at least one time-delayed Q component of the signal). Based on the received signal components (and any time-delayed signal components), the skew correction circuitry 230 can generate a skew correction signal that can compensate for gain and phase skew caused by the mixer (as with mixer predistortion component 210 and imbalance correction component 220, this can be done by predistorting the signal to compensate for gain and phase skew). The skew correction signal can include I and Q components (e.g., a skew correction I component and a skew correction Q component), each of which can be based on a linear combination (e.g., based on real coefficients) of the signal I and Q components and any received time-delayed signal I and Q components. As with the mixer predistortion and imbalance correction signals discussed above, the coefficients of the skew correction signal can also be determined based at least in part on the signal I and Q components, and signals received via an observation path (e.g., via a feedback receiver, etc.), such as via a least-squares or other approximation technique to model the gain and phase skew.

PA predistortion circuitry 240 can receive the signal I and Q components (and optionally at least one time-delayed I component of the signal and at least one time-delayed Q component of the signal). Based on the received signal components (and any time-delayed signal components), the PA predistortion circuitry 230 can generate a PA predistortion signal that can compensate for nonlinearities and memory effects caused by the mixer and nonlinearities and memory effects caused by a PA associated with the mixer (e.g., a PA that amplifies the signal after upconversion by the mixer). In connection with the example embodiment described herein where the mixer output is modeled (with a third order approximation) as $x(t)+\alpha \cdot 3 \cdot \beta \cdot \bar{x}(t)^3 + \alpha \cdot 3 \cdot (1+2 \cdot \beta^2) \cdot |x(t)|^2 \cdot x(t)$, PA predistortion circuitry 210 can correct for the $\alpha \cdot 3 \cdot (1+2 \cdot \beta^2) \cdot |x(t)|^2 \cdot x(t)$ term.

As can be seen in FIG. 2, for each of circuitry 210-240 that are included, the corresponding signals can be combined to generate a combined predistortion and/or correction signal that can compensate for various signal impairments introduced by a mixer (and optionally by a PA). Additionally, it can be seen from the example architecture of FIG. 2 that signal impairments from both a mixer (e.g., nonlinearities, memory effects, and gain and phase skew and imbalance) and a PA (e.g., nonlinearities and memory effects) can be estimated based on the same transmitted packet using a common infrastructure.

Figure 3:
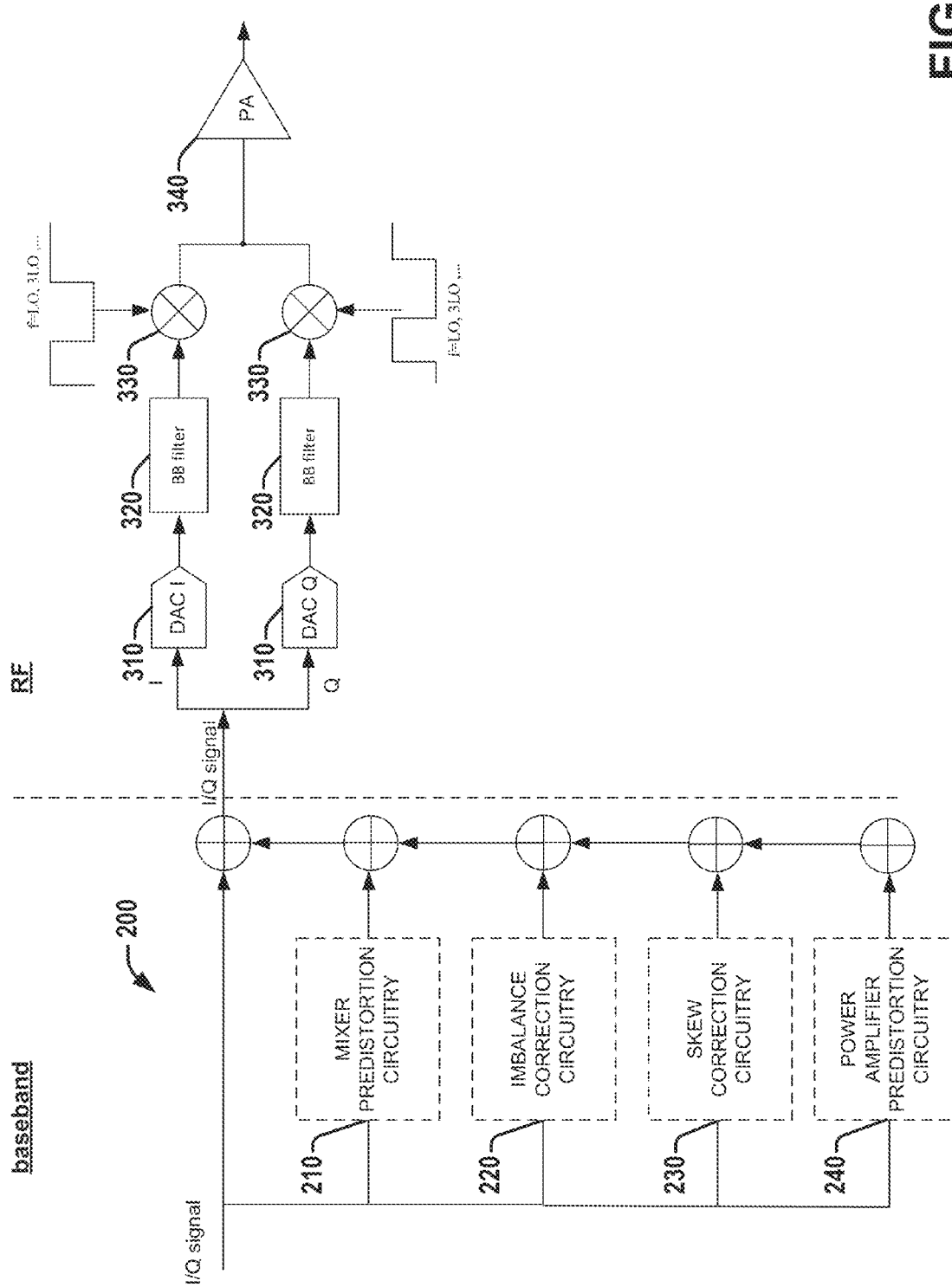
FIG. 3 is a block diagram illustrating the example system of FIG. 2 employed in connection with a mixer, according to various aspects described herein.

Referring to FIG. 3, illustrated is a block diagram of the example system 200 of FIG. 2 employed in connection with a mixer, according to various aspects described herein. In the embodiment shown in FIG. 3, system 200 can be included as part of the baseband processing of the signals. The I and Q signals output by system 200 can be converted to analog signals by digital-to-analog converters (DACs) 310, filtered by baseband (BB) filters 320, and then upconverted to RF signals by mixing with local oscillator (LO) signals by mixers 330. The signals can be amplified by a mixer amplifying block (not shown) and power amplifier 340.

Figure 4:
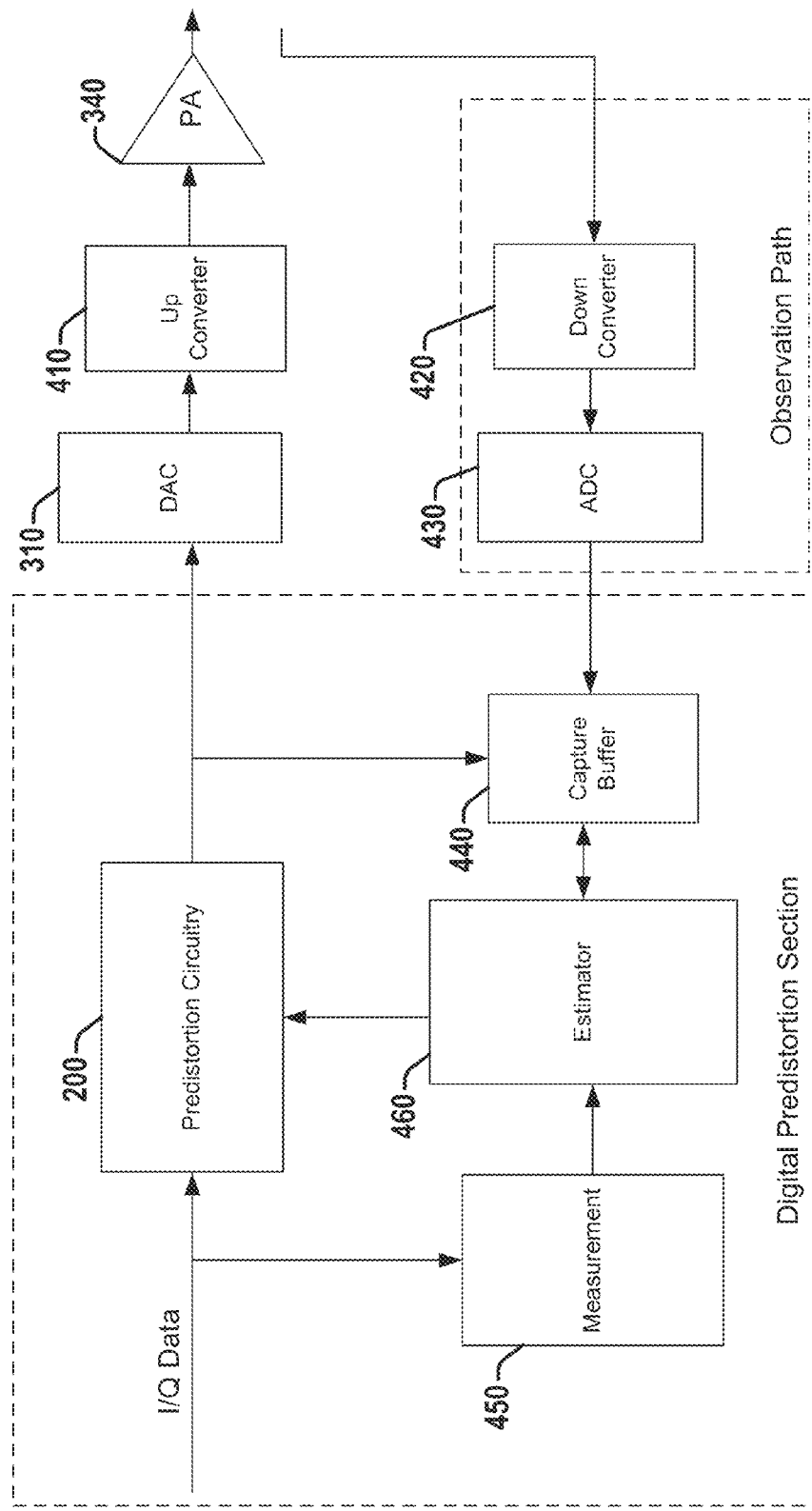
FIG. 4 is a block diagram illustrating an example implementation of the system of FIG. 2 in connection with an observation path according to various aspects described herein.

FIG. 4 is a block diagram of an example implementation of the system of FIG. 2 in connection with an observation path according to various aspects described herein. The embodiment shown in FIG. 4 is one example implementation of system 200 that shows the architecture in system context with a typical transmit chain and observation path (e.g., of a UE, etc.). This implementation can include system 200, DAC (or DACs) 310, upconverter 410 (e.g., which can include one or more of BB filter(s) 320, mixer(s) 330, a mixer amplifying block, etc.) that can upconvert a received BB signal to an RF signal, and PA 340. This implementation can also include an observation path (e.g., configured to receive a signal from a feedback receiver via a coupler, etc.) that includes a down converter 420 to downconvert the received (RF) signal to a BB signal, and an analog-to-digital converter (ADC) 430. Finally, the implementation can include additional circuitry to obtain signal components and determine coefficients used by system 200, such as a capture buffer 440, measurement circuitry 450, and an estimator 460.

The DAC(s) 310 can operate on inputs at the sample rate or after interpolation to a matching rate. The RF architecture may be of any of a variety of types. For an I/Q demodulator architecture, the down converted signal can be sampled at the predistortion sample rate in order for the full bandwidth to be available.

Capture buffer 440 can store samples of signals output by system 200 and signals received via the observation path (e.g., signals as impaired by the mixer and PA). Measurement circuitry 450 can measure the incoming signal I and Q components (e.g., before predistortion and/or impairment correction by system 200). Depending on the specific embodiment (e.g., what orders of terms and memory depth system 200 compensates based on), capture buffer 440 and/or measurement circuitry 450 can be configured to obtain the appropriate signal samples.

Estimator circuitry 460 can receive signal samples obtained via capture buffer 440 and measurement circuitry 450, and can adaptive compute coefficients associated with at least one of the mixer nonlinearities, mixer memory effects, gain and phase imbalance, gain and phase skew, PA nonlinearities, and PA memory effects. These coefficients can be obtained based on approximating the coefficients via a least squares (or other) approximation based on the samples received from capture buffer 440 and measurement circuitry 450. In various aspects, estimator circuitry 460 can be implemented, for example, via a processor executing software to perform the estimation, via hardware that performs the estimation, or via a combination of hardware and software. Coefficients determined by estimator circuitry 460 can be output to system 200 to predistort the signal to compensate for various mixer (and optionally PA) impairments to the signal. In various aspects, capture of signal samples and estimation of coefficients can occur intermittently (e.g., periodically, based on certain conditions (e.g., device powering on, etc.), etc.).

Figure 5:
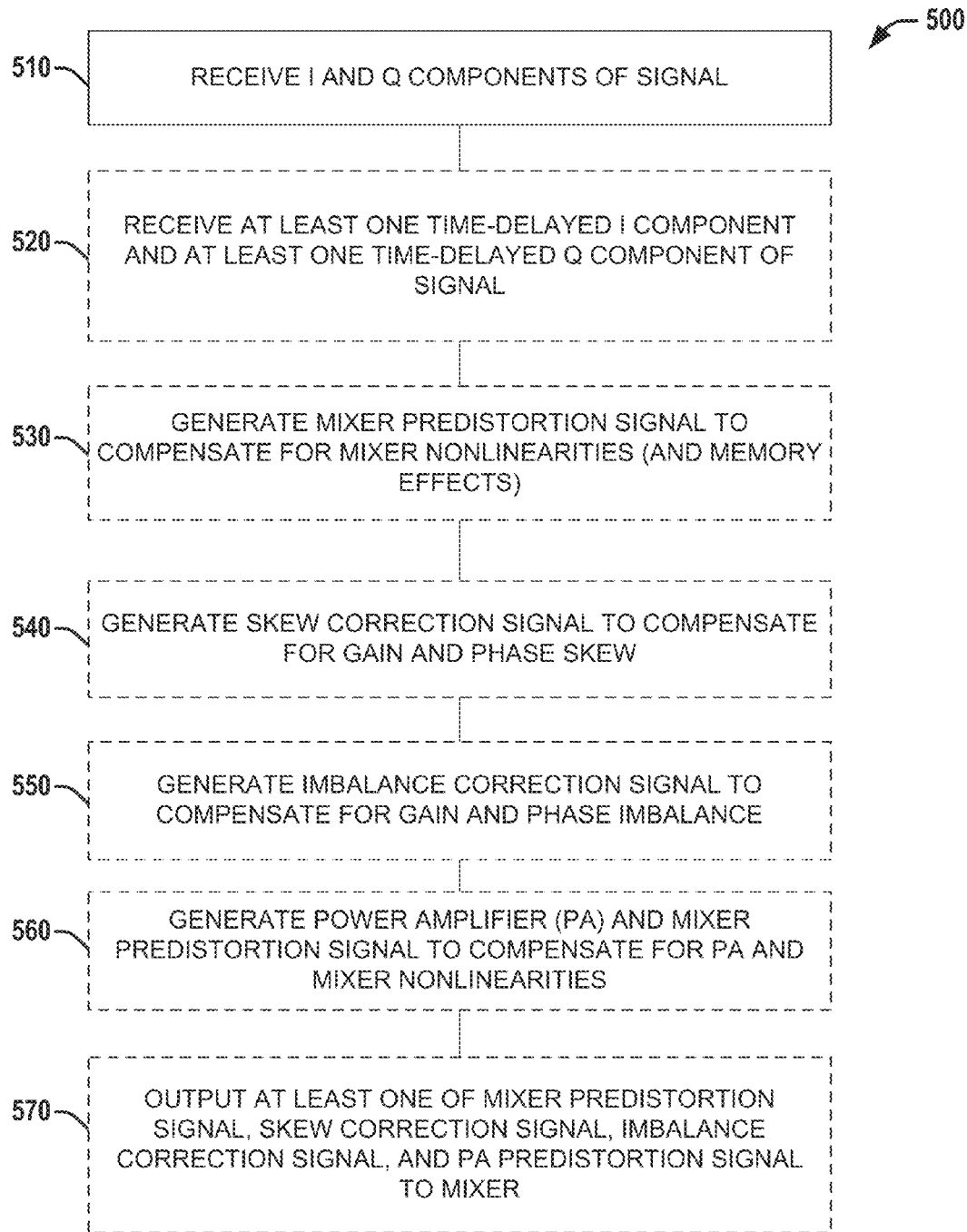
FIG. 5 is a flow diagram illustrating an example method of compensation for signal impairments introduced by a mixer according to various aspects described herein.

FIG. 5 is a flow diagram of an example method 500 of compensation for signal impairments introduced by a mixer according to various aspects described herein.

At 510, I and Q components of a signal can be received.

Optionally, at 520, at least one time-delayed I component of the signal and at least one time-delayed Q component of the signal can be received.

Depending on the specific embodiment, one, some or all of 530-560 can be included.

At 530, a mixer predistortion signal can be generated based on the signal I and Q components to compensate for nonlinearities that are introduced into the signal by a mixer. Optionally, if 520 was included, the mixer predistortion signal can also compensate for memory effects introduced by the mixer (e.g., terms such as $\alpha \cdot 3 \cdot \beta \cdot \bar{x}(t)^3$, in the third order model described herein), based on the at least one time-delayed signal I component and the at least one time-delayed signal Q component.

At 540, a skew correction signal can be generated based on the signal I and Q components, the at least one time-delayed signal I component, and the at least one time-delayed signal Q component, to compensate for gain and phase skew that are introduced into the signal by the mixer.

At 550, an imbalance correction signal can be generated based on the signal I and Q components to compensate for gain and phase imbalance that are introduced into the signal by the mixer.

At 560, a PA predistortion and mixer predistortion signal can be generated based on the signal I and Q components (and optionally, if 520 was included, on the at least one time-delayed signal I component and the at least one time-delayed signal Q component) to compensate for nonlinearities (and, if 520 was included, memory effects) introduced into the signal by the mixer (e.g., terms such as $\alpha \cdot 3 \cdot (1+2 \cdot \beta^2) \cdot |x(t)|^2 \cdot x(t)$, in the third order model described herein) and a PA associated with the mixer.

At 570, signals that were generated during 530-560 can be combined and output to a mixer and/or PA to correct for signal impairments introduced by the mixer and/or PA.

As discussed elsewhere herein, various embodiments can model nonlinearities and memory effects to varying degrees, depending on the terms that are included in the model. For example, for an embodiment addressing third order nonlinearities, the mixer nonlinearity term is described by expression 1:

$$\alpha \cdot 3 \cdot \beta \cdot \bar{x}(t)^3 + \alpha \cdot 3 \cdot (1+2 \cdot \beta^2) \cdot |x(t)|^2 \cdot x(t) \quad (1),$$

where x(t) is the signal before predistortion and introduction of mixer impairments. The $\alpha \cdot 3 \cdot \beta \cdot \bar{x}(t)^3$ term contains the unwanted artifacts $I^3$, $Q^3$, $I^2*Q$, and $Q^2*I$.

In general, mixer nonlinearity and memory effect models employed in connection with various embodiments can be represented as $$x(t) + \alpha \cdot 3 \cdot \beta \cdot \bar{x}(t-l)^k + \alpha \cdot 3 \cdot (1+2 \cdot \beta^2) \cdot |x(t-l)|^{k-1} \cdot x(t-l) \quad (2),$$

where k is the degree of the polynomial (with nonlinearities addressed when k>1) and l is the memory depth. The models can deal with any polynomial degree k, and act on I and Q and any cross terms of I and Q. Memory effects can be embedded in the model by using x(n), x(n−1), ... x(n−l) when the memory depth l is greater than 0.

Gain and phase imbalance impairments can be modeled by equations 3 and 4, $$I = \text{Real}(x) \quad (3)$$

$$Q = \text{Imag}(x) \quad (4),$$

with imbalance correction signal components $\check{I}$ and $\check{Q}$ given by equations 5 and 6:

$$\check{I} = \alpha \cdot I + \beta \cdot Q \quad (5)$$

$$\check{Q} = \gamma \cdot Q + \delta \cdot I \quad (6),$$

where the above coefficients ($\alpha, \beta, \gamma, \delta$) are real coefficients which create the phase and gain imbalance. In order to overcome these kinds of impairments, I and Q can be separated as described in the correction model discussed herein.

Skew impairments can be modeled by equations 7 and 8:

$$I = \text{Real}(x) \quad (7)$$

$$Q = \text{Imag}(x) \quad (8),$$

with skew correction signal components $\check{I}$ and $\check{Q}$ given by equations 9 and 10:

$$\check{I}(n) = \alpha \cdot I(n) + \beta \cdot I(n-1) + \ldots + \psi I(n-\xi) + \eta' \cdot Q(n) + \zeta' \cdot Q'(n-1) + \ldots + \epsilon' Q(n-\xi) \quad (9)$$

$$\check{Q}(n) = \eta \cdot Q(n) + \zeta \cdot Q(n-1) + \ldots + \epsilon Q(n-\xi) + \alpha' \cdot I(n) + \beta' \cdot I(n-1) + \ldots + \psi' I(n-\xi) \quad (10),$$

where the above coefficients ($\alpha, \beta, \psi, \eta, \zeta \ldots$) are real coefficients which create the phase and gain frequency selective. The selectivity behavior in the frequency domain is caused by phase or gain difference. In order to overcome this kind of impairment, I and Q can be separated as described in the correction model discussed herein.

In accordance with a set of example embodiments, a correction model can be employed incorporating up to third order terms with a memory depth of one for modeling mixer impairments including nonlinearities, memory effects, imbalance, and skew, as seen in equation 11:

$$\sum_{k=1,3} \sum_{q=0,1} q_{kq} \text{ Re}\{x[n-q]\}^k + \sum_{k=1,3} \sum_{q=0,1} r_{kq} \text{ Im}\{x[n-q]\}^k, \quad (11)$$

where $q_{kq}$ and $r_{kq}$ are complex coefficients, with real and imaginary coefficients given by equations 12 and 13:

$$\text{real\_coef} = I(n) \cdot a_{11} + I(n-1) \cdot a_{12} + Q(n) \cdot b_{11} + Q(n-1) \cdot b_{12} + I^3(n) \cdot a_{31} + I^3(n-1) \cdot a_{32} + Q^3(n) \cdot b_{31} + Q^3(n-1) \cdot b_{32} \quad (12)$$

$$\text{imag\_coef} = I(n) \cdot c_{11} + I(n-1) \cdot c_{12} + Q(n) \cdot d_{11} + Q(n-1) \cdot d_{12} + I^3(n) \cdot c_{31} + I^3(n-1) \cdot c_{32} + Q^3(n) \cdot d_{31} + Q^3(n-1) \cdot d_{32} \quad (13).$$

In accordance with the same or another set of example embodiments, some impairments can be modeled as seen in equation 14:

$$x[n] \left( \sum_{q'=0,1,2} r1_q \text{, Re}\{x[n-q']\} + \sum_{q'=0,1,2} l1_q \text{, Im}\{x[n-q']\} + \sum_{q'=0,1,2} r2_q \text{, Re}\{x[n-q']\}^2 + \sum_{q'=0,1,2} l2_q \text{, Im}\{x[n-q']\}^2 \right), \quad (14)$$

with real and imaginary coefficients given by equations 15 and 16:

$$\text{real\_coef} = I^2(n) \cdot e_{21} + I^2(n-1) \cdot e_{22} + I^2(n-2) \cdot e_{23} + Q^2(n) \cdot f_{21} + Q^2(n-1) \cdot f_{22} + Q^2(n-2) \cdot f_{23} \quad (15)$$

$$\text{imag\_coef} = I^2(n) \cdot g_{21} + I^2(n-1) \cdot g_{22} + I^2(n-2) \cdot g_{23} + Q^2(n) \cdot h_{21} + Q^2(n-1) \cdot h_{22} + Q^2(n-2) \cdot h_{23} \quad (16).$$

Figure 6:
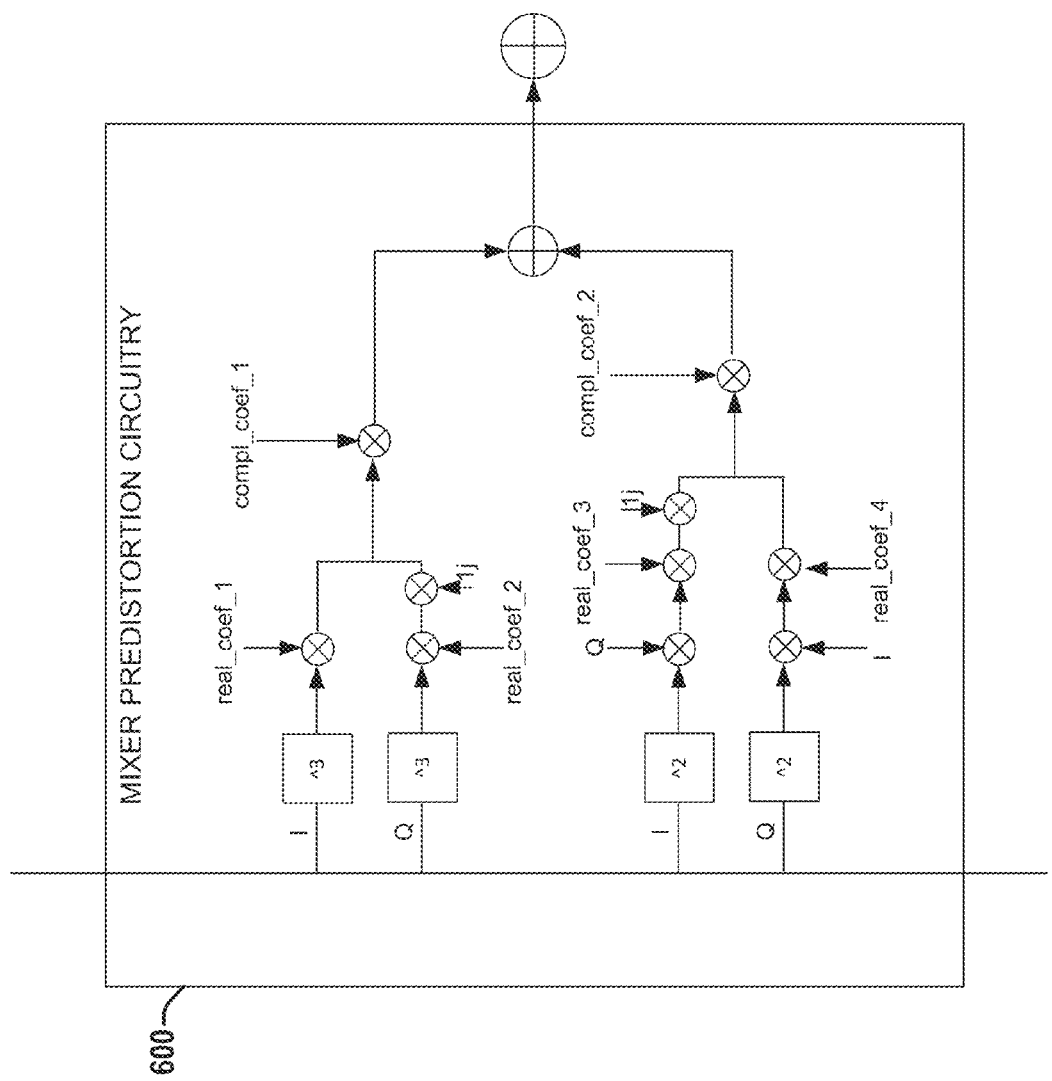
FIG. 6 is a circuit diagram illustrating an example embodiment of mixer predistortion circuitry employing third order terms to compensate for mixer nonlinearities according to various aspects described herein.
Figure 7A:
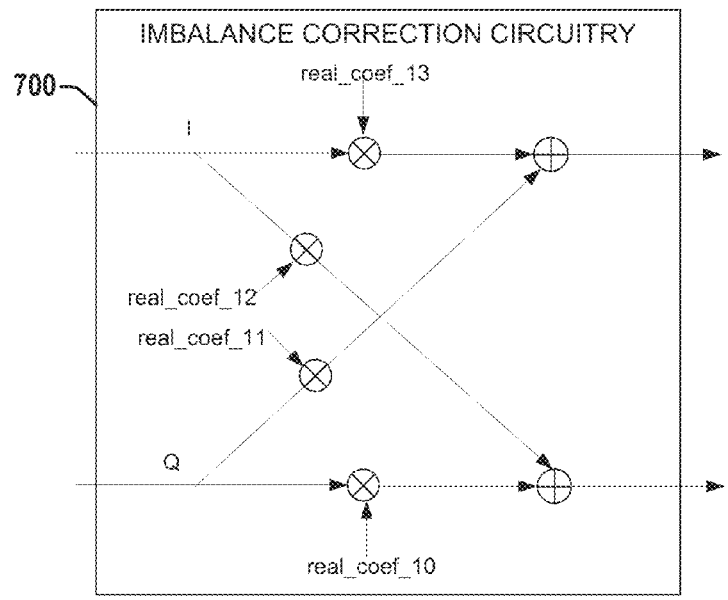
FIG. 7A is a circuit diagram illustrating an example embodiment of imbalance correction circuitry that can compensate for gain and phase imbalance according to various aspects described herein.
Figure 7B:
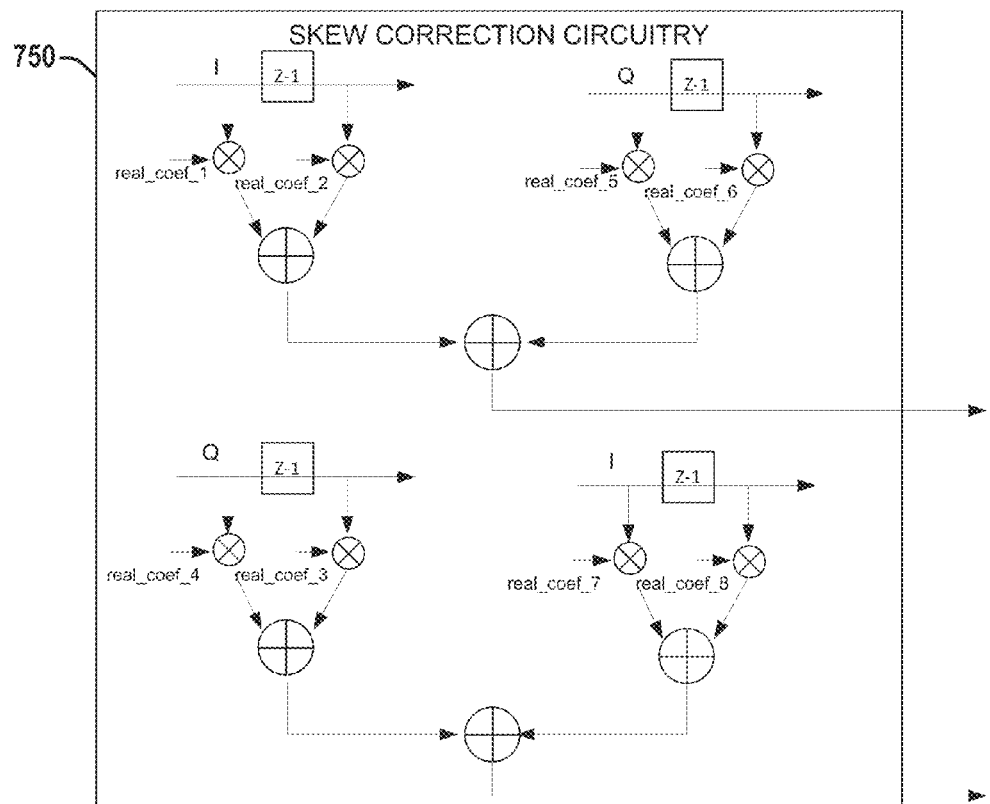
FIG. 7B is a circuit diagram illustrating an example embodiment of skew correction circuitry employing in-phase (I) and quadrature (Q) components along with time-delayed I and Q components of a signal to compensate for gain and phase skew according to various aspects described herein.

Example circuitry implementing equations 11 through 16 are provided in FIGS. 6, 7A, and 7B. Although FIGS. 6, 7A, and 7B illustrate specific embodiments of circuitry for a specific example model (e.g., multiplying and adding signals and time-delayed signals in the specific combinations illustrated), it is to be appreciated that in other embodiments, other circuitry can be employed to achieve the same result, or different models of mixer impairments can be employed as discussed herein, with corresponding variations in the circuitry that compensates for those mixer impairments.

FIG. 6 illustrates a circuit diagram of an example embodiment of mixer predistortion circuitry 600 employing third order terms to compensate for mixer nonlinearities according to various aspects described herein. As can be seen in FIG. 6, the example mixer predistortion circuitry 600 illustrated compensates based on third-order terms ($I^3$ and $Q^3$ in the upper half of example mixer predistortion circuitry 600, and $I^2*Q$ and $Q^2*I$ in the lower half), with coefficients that can be estimated based on signal samples to approximate (e.g., in a least-squares sense) mixer nonlinearities. For ease of illustration, FIG. 6 does not show additional circuitry to estimate mixer memory effects, but example mixer predistortion circuitry 600 can also include circuitry to approximate memory effects based on estimating coefficients for time-delayed I and Q signals to a memory depth l (e.g., 1, 2, etc.).

FIG. 7A illustrates a circuit diagram of an example embodiment of imbalance correction circuitry 700 that can compensate for gain and phase imbalance according to various aspects described herein. As can be seen, I and Q components of an imbalance correction signal output by example imbalance correction circuitry 700 can each be a linear combination (based on real coefficients) of the I and Q components of a received signal.

FIG. 7B illustrates a circuit diagram of an example embodiment of skew correction circuitry 750 employing I and Q components and time-delayed I and Q components of a signal to compensate for gain and phase skew according to various aspects described herein. As can be seen, I and Q components of a skew correction signal output by example imbalance correction circuitry 700 can each be a linear combination (based on real coefficients) of the I and Q components of a received signal and time-delayed I and Q components of the received signal.

Figure 8:
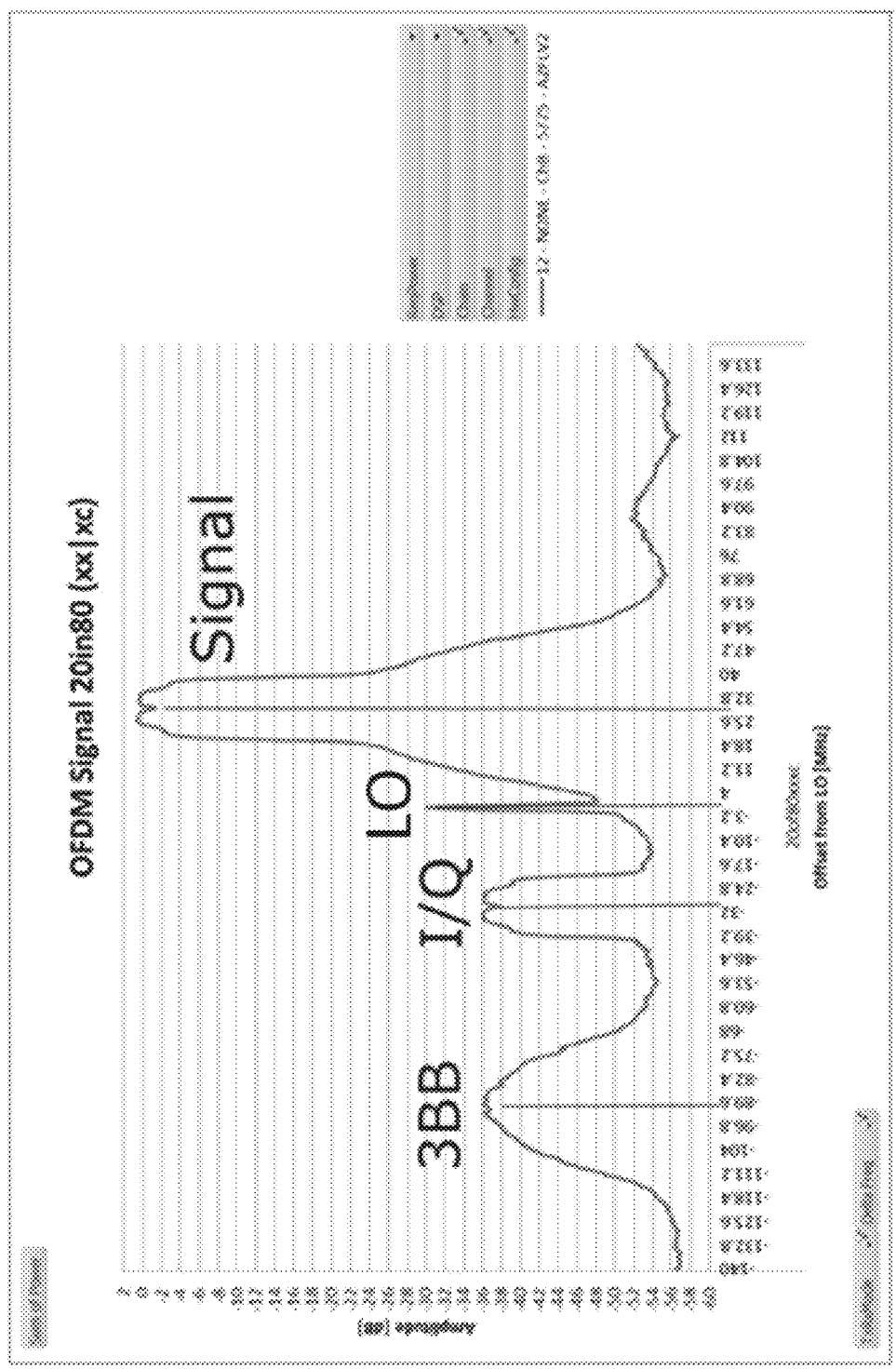
FIG. 8 is a graph illustrating the expected frequency locations of signal impairments arising from mixer nonlinearities and I/Q mismatch.

FIG. 8 is a graph showing the expected frequency locations of signal impairments arising from mixer nonlinearities and I/Q mismatch. The expected frequency locations of impairments arising from mixer nonlinearity are indicated by the peak labeled 3BB, and those arising from I/Q mismatch are indicated by the peak labeled I/Q.

Figure 9:
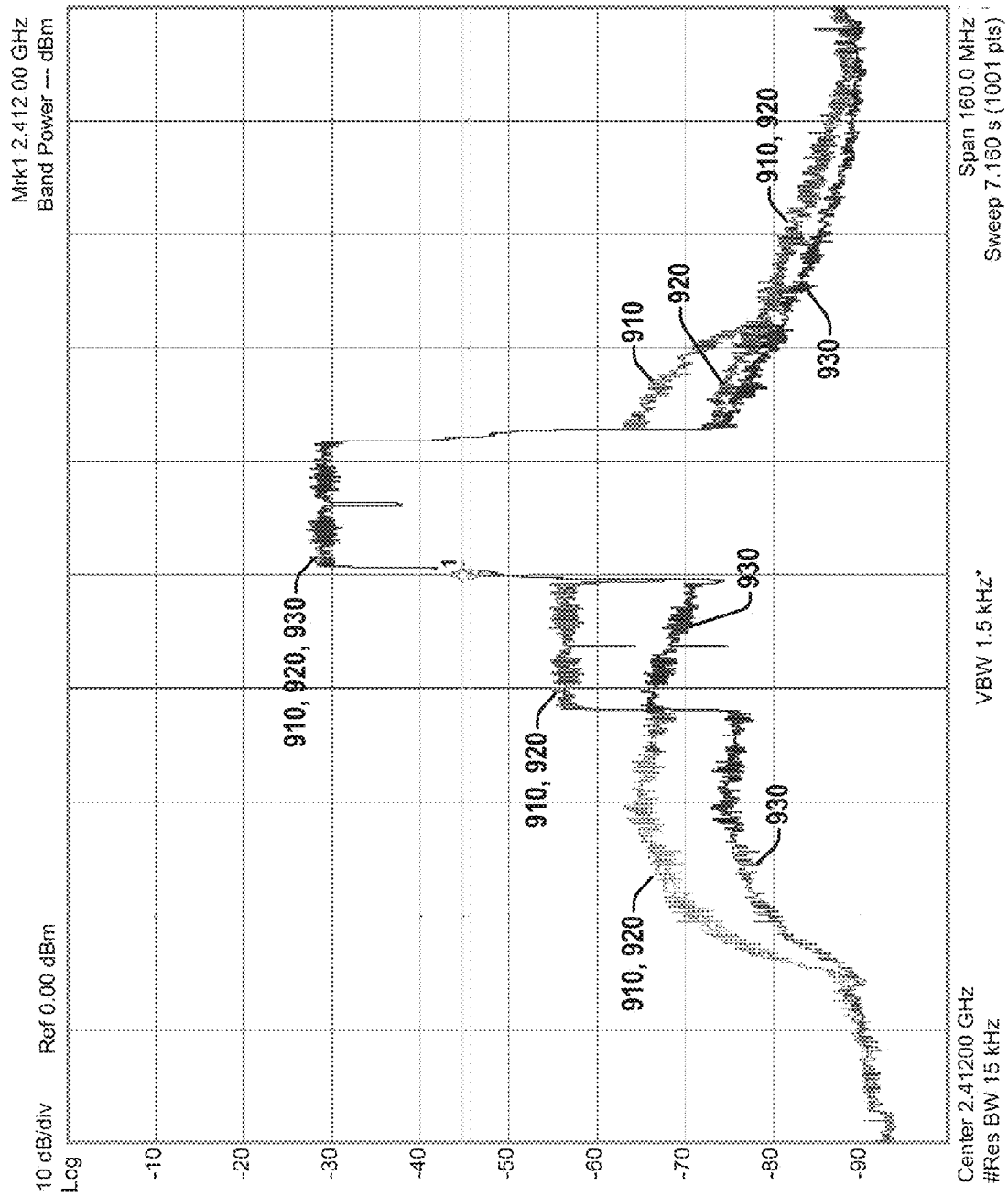
FIG. 9 is a graph illustrating a comparison of three signals: one without any correction, one with power amplifier (PA) predistortion, and one with PA predistortion as well as mixer impairment correction.

FIG. 9 is a graph comparing three signals, with varying degrees of compensation for signal impairments. Signal 910 is a signal before pre-distortion and correction for mixer nonlinearities. Signal 920 is the pre-distorted transmitted signal without compensation for mixer impairments such as nonlinearities and I/Q mismatch (e.g., without the terms addressed in the models discussed herein). As can be seen, signal 920 only compensates for the third-order intermodulation product (IM3) of the PA. Signal 930 is the pre-distorted transmitted signal with compensation for mixer nonlinearity and I/Q mismatch (e.g., with the terms addressed in the models discussed herein). As can be seen, in addition to addressing the IM3 of the PA, IQ mismatch and the mixer's nonlinearity (3BB) are handled, as well.

Figure 10:
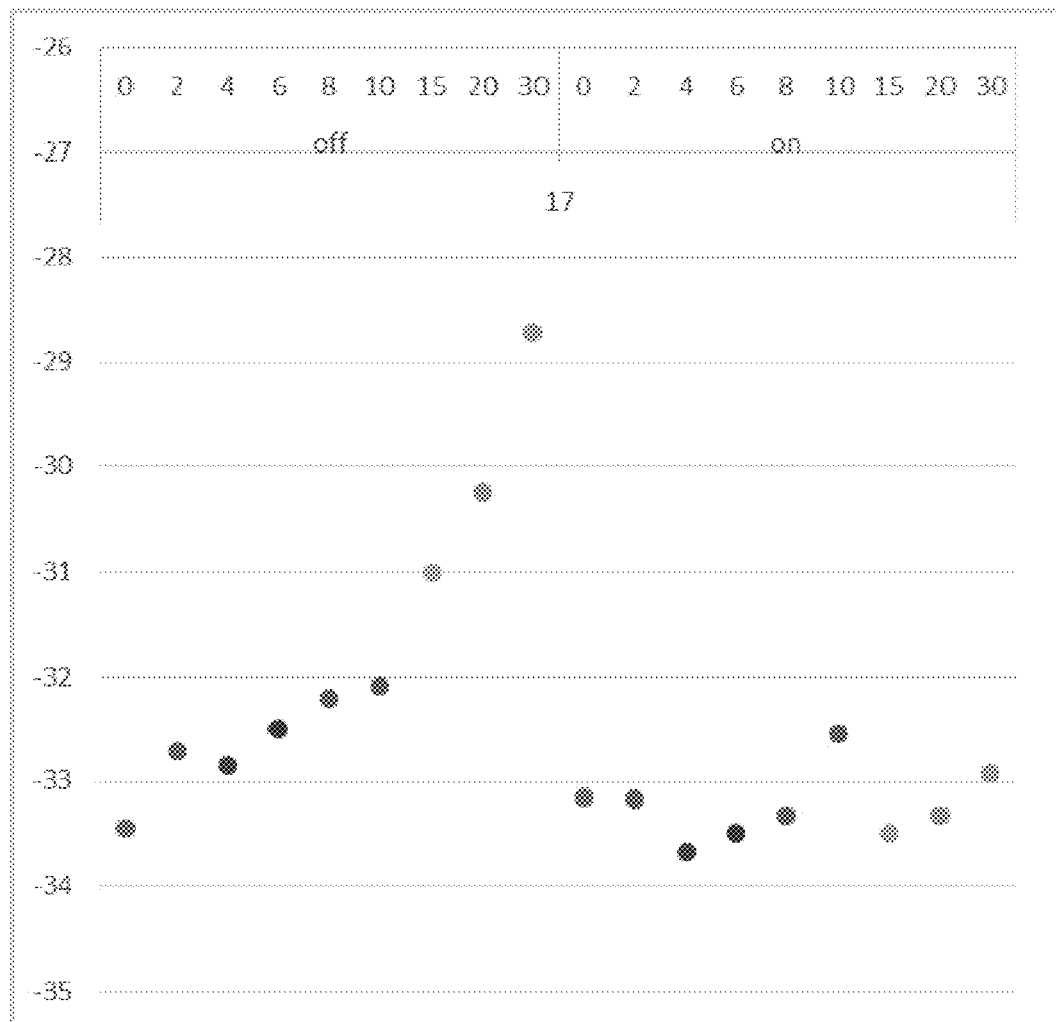
FIG. 10 is a graph illustrating error vector magnitude (EVM) as a function of skew values ranging from 0% to 30% without mixer impairment correction and with mixer impairment correction.

FIG. 10 is a graph of error vector magnitude (EVM) as a function of skew values ranging from 0% to 30% without mixer impairment correction (left side of graph, labeled 'off') and with mixer impairment correction (right side of graph, labeled 'on'). The signal transmitted in the experiment from which FIG. 10 was obtained was low power (around 2 dBm) in order to eliminate the influence of the non-linearity modeled by equation 11. The goal was to check the influence of the model in a system which suffered from skew only. As can be seen in FIG. 10, the EVM degraded when compensation was not applied and skew increased. However, the right side of the graph exhibited the opposite behavior when compensation was activated.

Figure 11:
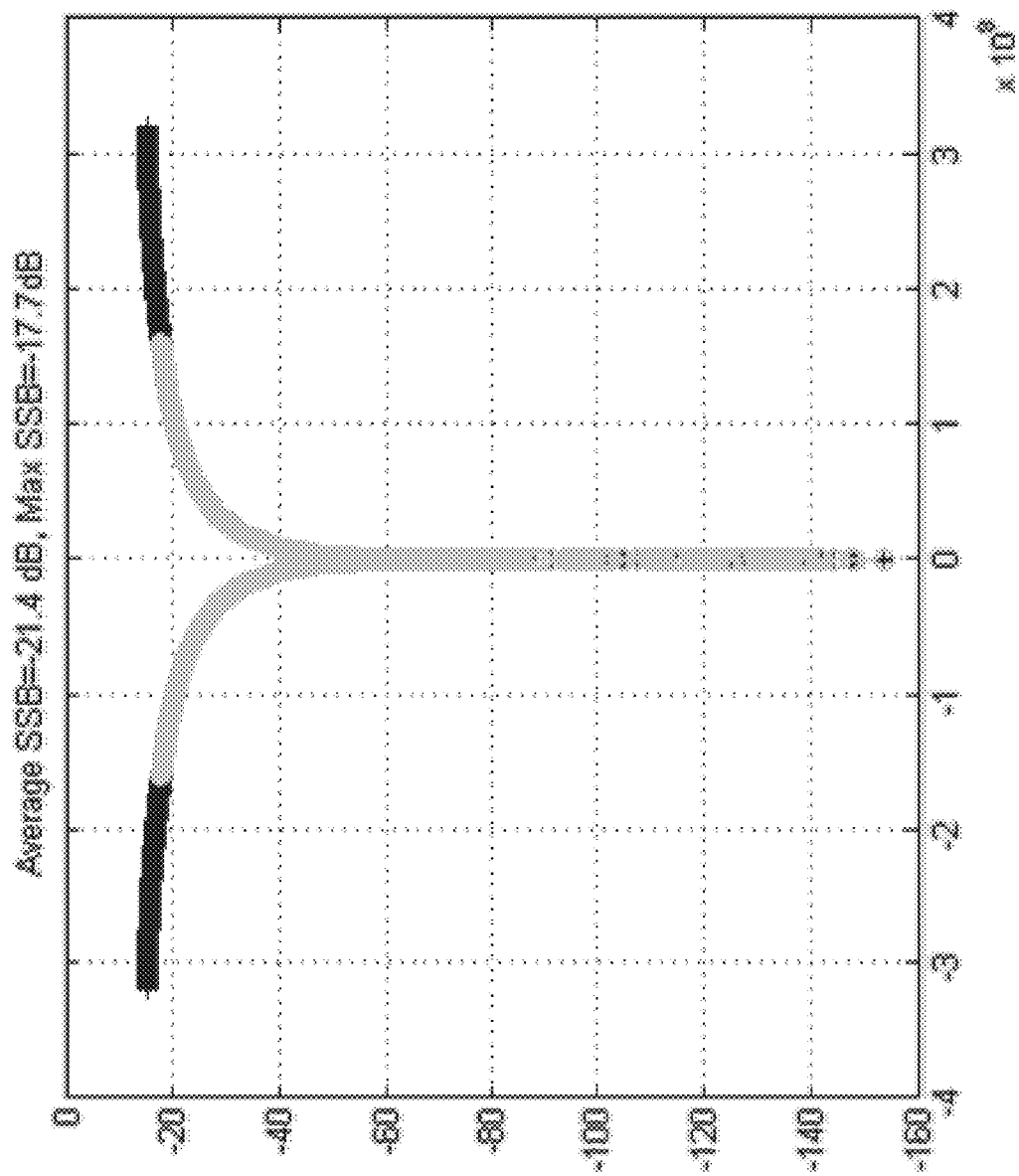
FIG. 11 is a graph illustrating gain-frequency selectivity at 30% skew with mixer impairment correction according to aspects described herein.

FIG. 11 is a graph illustrating gain-frequency selectivity at 30% skew with mixer impairment correction according to aspects described herein.

Figure 12:
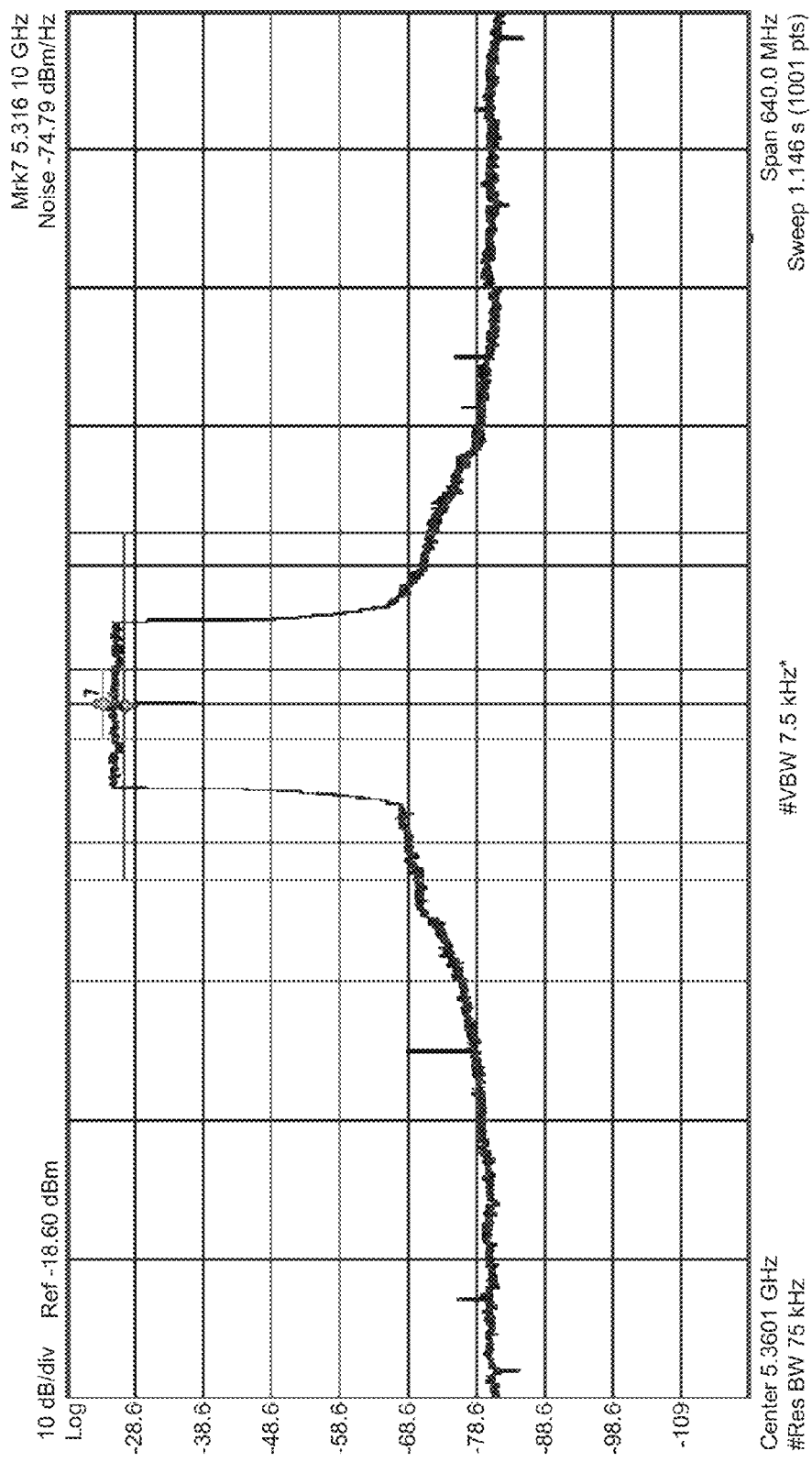
FIG. 12 is a graph illustrating, for skew values of 0%, 4%, 10%, 20%, and 30%, that there is no mask degradation after mixer impairment correction according to aspects described herein.

FIG. 12 is a graph indicating, for skew values of 0%, 4%, 10%, 20%, and 30%, that there is no mask degradation after mixer impairment correction according to aspects described herein.

Figure 13:
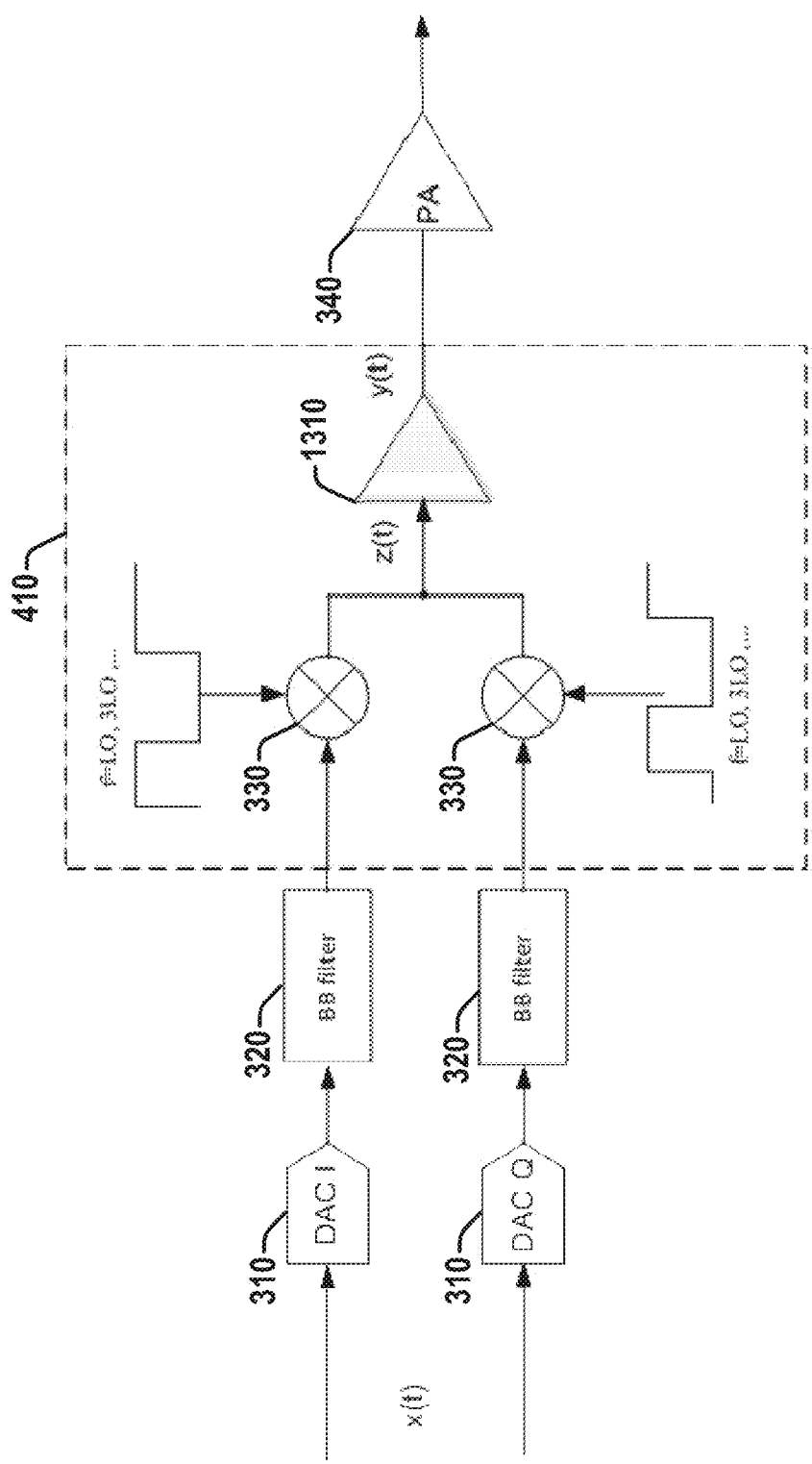
FIG. 13 is a block diagram illustrating an example square wave mixer model indicating how nonlinearities and other impairments can be introduced by a mixer.

The following is a more detailed explanation of the mathematics of one example (third order) model that can be employed in connection with embodiments described herein. While this specific derivation is provided to illustrate aspects discussed herein, it is to be appreciated that in various embodiments, other models described herein can be employed (e.g., fifth-order, etc.), with correspondingly varying derivations, albeit involving techniques similar to those discussed herein. Referring to FIG. 13, illustrated is a block diagram of an example square wave mixer model indicating how nonlinearities and other impairments can be introduced by a mixer. In FIG. 13, in addition to components and circuitry discussed above, a mixer amplifying block 1310 is also shown. Signal x(t) is the complex baseband signal before mixing, z(t) is the signal after mixing but before amplification by the mixer amplifying block 1310, and y(t) is the signal output by the mixer amplifying block 1310.

For simplicity, the mixer square wave can be modeled by the first two non-trivial harmonics, the first and third. It can be shown that the third harmonic of the mixer can be represented as $-e^{-i3\omega t}$, thus the input to the mixer amplifying block 1310 is as in equation 17:

$$z(t)=\text{Real}\{x(t) \cdot e^{+i\omega t}\}+\beta \cdot \text{Real}\{x(t) \cdot (-e^{-i3\omega t})\} \quad (17),$$

where x(t) is the complex baseband signal at the mixer input, $\omega$ is the target RF frequency, and $\beta$ is the (real-valued) attenuation of the third harmonic of the mixer.

Expanding the bracketed terms yields equation 18, and, after reorganization, equation 19:

$$z(t)=x(t) \cdot e^{+i\omega t}+\bar{x}(t) \cdot e^{-i\omega t}-x(t) \cdot \beta \cdot e^{-3\omega t}-\bar{x}(t) \cdot \beta \cdot e^{+i3\omega t} \quad (18)$$

$$z(t)=x(t) \cdot (e^{+i\omega t}-\beta \cdot e^{-i3\omega t})+\bar{x}(t) \cdot (e^{-i\omega t}-\beta \cdot e^{+i3\omega t}) \quad (19).$$

The mixer amplifying block 1310 can be modeled as $y(t)=z(t)+\alpha(z(t))^3$, giving an output of the mixer amplifying block 1310 with linear and nonlinear portions respectively given by expressions 20 and 21:

$$x(t) \cdot (e^{+i\omega t}-\beta \cdot e^{-i3\omega t})+\bar{x}(t) \cdot (e^{-\omega t}-\beta \cdot e^{+i3\omega t}) \quad (20)$$

$$\alpha \cdot \{(x(t) \cdot (e^{+i\omega t}-\beta \cdot e^{-i3\omega t}))^3+3 \cdot (x(t) \cdot (e^{+i\omega t}-\beta \cdot e^{-i3\omega t}))^2 \cdot (\bar{x}(t) \cdot (e^{-i\omega t}-\beta \cdot e^{+i3\omega t}))+3 \cdot (x(t) \cdot (e^{+i\omega t}-\beta \cdot e^{-i3\omega t})) \cdot (\bar{x}(t) \cdot (e^{-i\omega t}-\beta \cdot e^{+i3\omega t}))^2+(\bar{x}(t) \cdot (e^{-i\omega t}-\beta \cdot e^{+i3\omega t}))^3\} \quad (21),$$

The inband terms from the linear portion are given by expression 22 and the inband terms from the non-linear portion are given by expressions 23-26:

$$x(t) \cdot (e^{+i\omega t})+\bar{x}(t) \cdot (e^{-i\omega t}) \quad (22)$$

$$\alpha \cdot (x(t) \cdot (e^{+i\omega t}-\beta \cdot e^{-i3\omega t}))^3 \quad (23)$$

$$\alpha \cdot \{3 \cdot (x(t) \cdot (e^{+i\omega t}-\beta \cdot e^{-i3\omega t}))^2 \cdot (\bar{x}(t) \cdot (e^{-i\omega t}-\beta \cdot e^{+i3\omega t})) \quad (24)$$

$$\alpha \cdot \{3 \cdot (x(t) \cdot (e^{+i\omega t}-\beta \cdot e^{-i3\omega t}))^1 \cdot (\bar{x}(t) \cdot (e^{-i\omega t}-\beta \cdot e^{+i3\omega t}))^2 \quad (25)$$

$$\alpha \cdot (\bar{x}(t) \cdot (e^{-i\omega t}-\beta \cdot e^{+i3\omega t}))^3 \quad (26).$$

Omitting terms in expressions 23-26 with $\pm 2\omega$, $\pm 3\omega$ . . . yields expressions 27-30:

$$\alpha \cdot 3 \cdot x(t)^2 \cdot \beta \cdot e^{-i\omega t} \quad (27)$$

$$\alpha \cdot 3 \cdot x(t)^2 \cdot \bar{x}(t) \cdot (e^{+i\omega t}+2 \cdot \beta^2 \cdot e^{+i\omega t}) \quad (28)$$

$$\alpha \cdot 3 \cdot x(t) \cdot \bar{x}(t)^2 \cdot (e^{-i\omega t}+2 \cdot \beta^2 \cdot e^{-i\omega t}) \quad (29)$$

$$\alpha \cdot 3 \cdot \bar{x}(t)^2 \cdot \beta \cdot e^{+i\omega t} \quad (30),$$

which can be combined to yield expression 31:

$$\alpha \cdot 3 \cdot \beta \cdot \text{Re}(\bar{x}(t)^3 \cdot e^{+i\omega t}) + \alpha \cdot 3 \cdot |x(t)|^2 \cdot (\text{Re}(x(t) e^{+i\omega t}) \cdot (1 + 2 \cdot \beta^2) \tag{31}$$

which has a baseband equivalent as shown in expression 32:

$$\alpha \cdot 3 \cdot \beta \cdot \bar{x}(t)^3 + \alpha \cdot 3 \cdot (1 + 2 \cdot \beta^2) \cdot |x(t)|^2 \cdot x(t) \tag{32}$$

where $\beta$ is the (real-valued) attenuation of the third harmonic of the mixer, and $\alpha$ is the (complex) nonlinear gain of the mixer.

As can be seen, this model includes terms such as $\bar{x}(t)^3$, indicating that the following terms can be used in fitting the model (e.g., via a least-squares approximation) to specific signals: $I^3$, $Q^3$, $I^2 * Q$, and $Q^2 * I$. Note that the term $\alpha \cdot 3 \cdot (1 + 2 \cdot \beta^2) \cdot |x(t)|^2 \cdot x(t)$ is addressed via PA predistortion.

Figure 14:
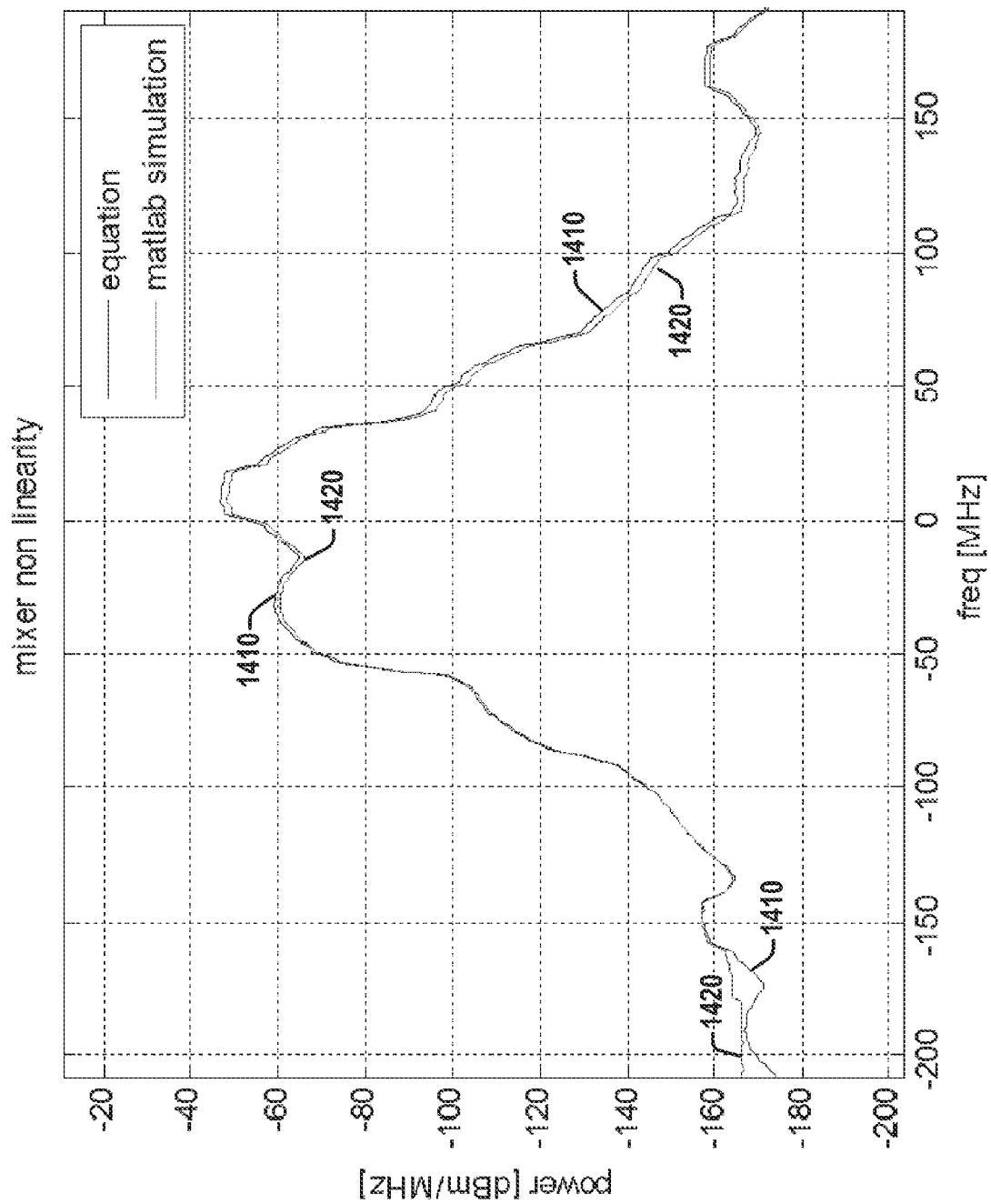
FIG. 14 is a graph illustrating agreement between a simulated mixer and a mixer impairment model according to aspects described herein.

The model was verified via Matlab simulation. The Matlab simulation involved a complex baseband signal passed through a nonlinear square wave mixer, compared with the mixer impairment model detailed above. FIG. 14 illustrates a graph showing the agreement between the mixer impairment model according to aspects described herein (1410) and the simulated mixer (curve 1420). The target signal is at 0-20 MHz, with the nonlinearities at around −30 MHz. As can be seen in FIG. 14, the model, even at third-order (the lowest order to include nonlinearities), very closely approximates the signal of the simulated mixer.

Examples herein can include subject matter such as a method, means for performing acts or blocks of the method, at least one machine-readable medium including executable instructions that, when performed by a machine (e.g., a processor with memory or the like) cause the machine to perform acts of the method or of an apparatus or system for concurrent communication using multiple communication technologies according to embodiments and examples described.

Example 1 is a system configured for use in a transmitter, comprising mixer predistortion circuitry configured to receive signal in-phase (I) and signal quadrature (Q) components of a signal and to generate a mixer predistortion signal based at least in part on the signal I and Q components, wherein the mixer predistortion signal compensates for nonlinearities caused by a mixer that upconverts the signal.

Example 2 includes the subject matter of example 1, wherein the mixer predistortion circuitry is additionally configured to receive at least one time-delayed signal I component and at least one time-delayed signal Q component, wherein the mixer predistortion signal compensates for memory effects caused by the mixer.

Example 3 includes the subject matter of any of examples 1-2, including or omitting optional features, wherein the mixer predistortion circuitry is configured to generate the mixer predistortion signal based on a polynomial approximation involving the signal I and Q components.

Example 4 includes the subject matter of any variation of example 3, wherein the polynomial approximation comprises one or more odd order terms of at least third order.

Example 5 includes the subject matter of any variation of example 4, wherein the one or more odd order terms comprise cross terms between the signal I component and the signal Q component.

Example 6 includes the subject matter of any variation of example 4, wherein at least one of the one or more odd order terms of at least third order is based at least in part on at least one time-delayed signal I component or at least one time-delayed signal Q component.

Example 7 includes the subject matter of any of examples 1-2, including or omitting optional features, wherein the mixer predistortion signal is based at least in part on a least squares approximation of at least one of the nonlinearities or memory effects caused by the mixer.

Example 8 includes the subject matter of any of examples 1-4, including or omitting optional features, further comprising imbalance correction circuitry configured to receive the signal I and Q components of the signal and to generate an imbalance correction signal based at least in part on the signal I and Q components, wherein the imbalance correction signal compensates for a gain and phase imbalance caused by the mixer.

Example 9 includes the subject matter of any variation of example 8, wherein the imbalance correction signal comprises an imbalance correction I component and an imbalance correction Q component, wherein each of the imbalance correction I component and the imbalance correction Q component are linear combinations of the signal I and Q components.

Example 10 includes the subject matter of any variation of example 9, wherein each of the imbalance correction I component and the imbalance correction Q component are linear combinations of the signal I and Q components based on real coefficients.

Example 11 includes the subject matter of any variation of example 8, wherein the imbalance correction signal is based at least in part on a least squares approximation of the gain and phase imbalance caused by the mixer.

Example 12 includes the subject matter of any of examples 1-11, including or omitting optional features, further comprising skew correction circuitry configured to receive the signal I and Q components of the signal and to generate a skew correction signal based at least in part on the signal I and Q components, wherein the skew correction signal compensates for a gain and phase skew caused by the mixer.

Example 13 includes the subject matter of any variation of example 12, wherein the skew correction circuitry is additionally configured to receive at least one time-delayed signal I component and at least one time-delayed signal Q component, wherein the skew correction signal is based at least in part on the at least one time-delayed signal I component and the at least one time-delayed signal Q component.

Example 14 includes the subject matter of any variation of example 13, wherein the skew correction signal comprises a skew correction I component and a skew correction Q component, wherein each of the skew correction I component and the skew correction Q component are linear combinations of the signal I component, the signal Q component, the at least one time-delayed signal I component, and the at least one time-delayed signal Q component.

Example 15 includes the subject matter of any variation of example 14, wherein each of the imbalance correction I component and the imbalance correction Q component are linear combinations of the signal I component, the signal Q component, the at least one time-delayed signal I component, and the at least one time-delayed signal Q component based on real coefficients.

Example 16 includes the subject matter of any variation of example 12, wherein the skew correction signal is based at least in part on a least squares approximation of the gain and phase skew caused by the mixer.

Example 17 includes the subject matter of example 1, wherein the mixer predistortion circuitry is configured to generate the mixer predistortion signal based on a polynomial approximation involving the signal I and Q components.

Example 18 includes the subject matter of example 17, wherein the polynomial approximation comprises one or more odd order terms of at least third order.

Example 19 includes the subject matter of example 18, wherein the one or more odd order terms comprise cross terms between the signal I component and the signal Q component.

Example 20 includes the subject matter of example 18, wherein at least one of the one or more odd order terms of at least third order is based at least in part on at least one time-delayed signal I component or at least one time-delayed signal Q component.

Example 21 includes the subject matter of example 1, wherein the mixer predistortion signal is based at least in part on a least squares approximation of at least one of the nonlinearities or memory effects caused by the mixer.

Example 22 includes the subject matter of example 1, further comprising imbalance correction circuitry configured to receive the signal I and Q components of the signal and to generate an imbalance correction signal based at least in part on the signal I and Q components, wherein the imbalance correction signal compensates for a gain and phase imbalance caused by the mixer.

Example 23 includes the subject matter of example 22, wherein the imbalance correction signal comprises an imbalance correction I component and an imbalance correction Q component, wherein each of the imbalance correction I component and the imbalance correction Q component are linear combinations of the signal I and Q components.

Example 24 includes the subject matter of example 23, wherein each of the imbalance correction I component and the imbalance correction Q component are linear combinations of the signal I and Q components based on real coefficients.

Example 25 includes the subject matter of example 22, wherein the imbalance correction signal is based at least in part on a least squares approximation of the gain and phase imbalance caused by the mixer.

Example 26 includes the subject matter of example 1, further comprising skew correction circuitry configured to receive the signal I and Q components of the signal and to generate a skew correction signal based at least in part on the signal I and Q components, wherein the skew correction signal compensates for a gain and phase skew caused by the mixer.

Example 27 includes the subject matter of example 26, wherein the skew correction circuitry is additionally configured to receive at least one time-delayed signal I component and at least one time-delayed signal Q component, wherein the skew correction signal is based at least in part on the at least one time-delayed signal I component and the at least one time-delayed signal Q component.

Example 28 includes the subject matter of example 27, wherein the skew correction signal comprises a skew correction I component and a skew correction Q component, wherein each of the skew correction I component and the skew correction Q component are linear combinations of the signal I component, the signal Q component, the at least one time-delayed signal I component, and the at least one time-delayed signal Q component.

Example 29 includes the subject matter of example 28, wherein each of the imbalance correction I component and the imbalance correction Q component are linear combinations of the signal I component, the signal Q component, the at least one time-delayed signal I component, and the at least one time-delayed signal Q component based on real coefficients.

Example 30 includes the subject matter of example 26, wherein the skew correction signal is based at least in part on a least squares approximation of the gain and phase skew caused by the mixer.

Example 31 is a non-transitory machine readable medium comprising instructions that, when executed, cause a machine to: receive an in-phase (I) component of a signal and a quadrature (Q) component of the signal; generate a mixer predistortion signal that compensates for nonlinearities introduced by a mixer that upconverts the signal.

Example 32 includes the subject matter of example 31, wherein the instructions, when executed, further cause the machine to receive at least one time-delayed I component of the signal and at least one time-delayed Q component of the signal.

Example 33 includes the subject matter of example 32, wherein the mixer predistortion signal compensates for memory effects introduced by the mixer.

Example 34 includes the subject matter of any of examples 32-33, including or omitting optional features, wherein the instructions, when executed, further cause the machine to generate a skew correction signal that compensates for a gain and phase skew introduced by the mixer.

Example 35 includes the subject matter of any of examples 32-34, including or omitting optional features, wherein the skew correction signal comprises a skew correction I component and a skew correction Q component that are each based on a linear combination of the signal I component, the signal Q component, the at least one time-delayed I component of the signal, and the at least one time-delayed Q component of the signal.

Example 36 includes the subject matter of any of examples 31-35, including or omitting optional features, wherein the instructions, when executed, further cause the machine to generate an imbalance correction signal that compensates for a gain and phase imbalance introduced by the mixer.

Example 37 includes the subject matter of example 32, wherein the instructions, when executed, further cause the machine to generate a skew correction signal that compensates for a gain and phase skew introduced by the mixer.

Example 38 includes the subject matter of example 32, wherein the skew correction signal comprises a skew correction I component and a skew correction Q component that are each based on a linear combination of the signal I component, the signal Q component, the at least one time-delayed I component of the signal, and the at least one time-delayed Q component of the signal.

Example 39 includes the subject matter of example 31, wherein the instructions, when executed, further cause the machine to generate an imbalance correction signal that compensates for a gain and phase imbalance introduced by the mixer.

Example 40 includes the subject matter of example 39, wherein the imbalance correction signal comprises an imbalance correction I component and an imbalance correction Q component that are each based on a linear combination of the signal I component and the signal Q component.

Example 41 is a system configured for use in a transmitter, comprising mixer predistortion circuitry, imbalance correction circuitry, and skew correction circuitry. The mixer predistortion circuitry is configured to receive an in-phase (I) component of a signal, a quadrature (Q) component of the signal, at least one time-delayed I component of the signal, and at least one time-delayed Q component of the signal, wherein the mixer predistortion circuitry is configured to generate a mixer predistortion signal based at least in part on the I and Q components, the at least one time-delayed I component, and the at least one time-delayed Q component, wherein the mixer predistortion signal compensates for nonlinearities and memory effects caused by a mixer that upconverts the signal. The imbalance correction is circuitry configured to receive the I and Q components of the signal and to generate an imbalance correction signal based at least in part on the I and Q components, wherein the imbalance correction signal compensates for a gain and phase imbalance caused by the mixer. The skew correction circuitry is configured to receive the I and Q components of the signal, the at least one time-delayed I component, and the at least one time-delayed Q component, wherein the skew correction circuitry is configured to generate a skew correction signal based at least in part on the I component, the Q component, the at least one time-delayed I component, and the at least one time-delayed Q component, wherein the skew correction signal compensates for a gain and phase skew caused by the mixer.

Example 42 includes the subject matter of example 41, further comprising power amplifier (PA) predistortion circuitry configured to receive the I and Q components, the at least one time-delayed I component of the signal, and the at least one time-delayed Q component of the signal, and to generate a PA predistortion signal based at least in part on the I and Q components, the at least one time-delayed I component of the signal, and the at least one time-delayed Q component of the signal, wherein the PA predistortion signal compensates for nonlinearities and memory effects caused by a PA that amplifies the signal.

Example 43 is a system configured for use in a transmitter, comprising means for mixer predistortion configured to receive signal in-phase (I) and signal quadrature (Q) components of a signal and to generate a mixer predistortion signal based at least in part on the signal I and Q components, wherein the mixer predistortion signal compensates for nonlinearities caused by a mixer that upconverts the signal.

Example 44 is a system configured for use in a transmitter, comprising means for mixer predistortion, means for imbalance correction, and means for skew correction. The means for mixer predistortion is configured to receive an in-phase (I) component of a signal, a quadrature (Q) component of the signal, at least one time-delayed I component of the signal, and at least one time-delayed Q component of the signal, wherein the means for mixer predistortion is configured to generate a mixer predistortion signal based at least in part on the I and Q components, the at least one time-delayed I component, and the at least one time-delayed Q component, wherein the mixer predistortion signal compensates for nonlinearities and memory effects caused by a mixer that upconverts the signal. The means for imbalance correction is configured to receive the I and Q components of the signal and to generate an imbalance correction signal based at least in part on the I and Q components, wherein the imbalance correction signal compensates for a gain and phase imbalance caused by the mixer. The means for skew correction is configured to receive the I and Q components of the signal, the at least one time-delayed I component, and the at least one time-delayed Q component, wherein the skew correction circuitry is configured to generate a skew correction signal based at least in part on the I component, the Q component, the at least one time-delayed I component, and the at least one time-delayed Q component, wherein the skew correction signal compensates for a gain and phase skew caused by the mixer.

The above description of illustrated embodiments of the subject disclosure, including what is described in the Abstract, is not intended to be exhaustive or to limit the disclosed embodiments to the precise forms disclosed. While specific embodiments and examples are described herein for illustrative purposes, various modifications are possible that are considered within the scope of such embodiments and examples, as those skilled in the relevant art can recognize.

In this regard, while the disclosed subject matter has been described in connection with various embodiments and corresponding Figures, where applicable, it is to be understood that other similar embodiments can be used or modifications and additions can be made to the described embodiments for performing the same, similar, alternative, or substitute function of the disclosed subject matter without deviating therefrom. Therefore, the disclosed subject matter should not be limited to any single embodiment described herein, but rather should be construed in breadth and scope in accordance with the appended claims below.

In particular regard to the various functions performed by the above described components or structures (assemblies, devices, circuits, systems, etc.), the terms (including a reference to a "means") used to describe such components are intended to correspond, unless otherwise indicated, to any component or structure which performs the specified function of the described component (e.g., that is functionally equivalent), even though not structurally equivalent to the disclosed structure which performs the function in the herein illustrated exemplary implementations. In addition, while a particular feature may have been disclosed with respect to only one of several implementations, such feature may be combined with one or more other features of the other implementations as may be desired and advantageous for any given or particular application.

What is claimed is:

1. A system configured for use in a transmitter, comprising:
    baseband circuitry that generates a first signal comprising signal in-phase (I) and signal quadrature (Q) components;
    wherein the baseband circuitry comprises a skew correction circuitry to generate a skew correction signal to compensate for a gain and phase skew caused by a mixer circuit, based at least in part on the signal I and Q components of the first signal;
    wherein the skew correction signal comprises a skew correction I component and a skew correction Q component, wherein each of the skew correction I component and the skew correction Q component are linear combinations of the signal I component, the signal Q component, and at least one time-delayed signal I component or at least one time-delayed signal Q component, and
    wherein the baseband circuitry comprises mixer predistortion circuitry configured to generate a mixer predistortion signal based on a polynomial approximation involving the signal I and Q components.

2. The system of claim 1, wherein the baseband circuitry comprises mixer predistortion circuitry configured to receive at least one time-delayed signal I component and at least one time-delayed signal Q component, wherein the mixer predistortion circuitry is configured to generate a mixer predistortion signal that compensates for memory effects caused by the mixer circuit.

3. The system of claim 1, wherein the polynomial approximation comprises one or more odd order terms of at least third order.

4. The system of claim 3, wherein the one or more odd order terms comprise cross terms between the signal I component and the signal Q component.

5. The system of claim 3, wherein at least one of the one or more odd order terms of at least third order is based at least in part on at least one time-delayed signal I component or at least one time-delayed signal Q component.

6. The system of claim 1, wherein the mixer predistortion circuitry is configured to generate the mixer predistortion signal based at least in part on a least squares approximation of at least one of nonlinearities or memory effects caused by the mixer circuit.

7. The system of claim 1, further comprising imbalance correction circuitry configured to receive the signal I and Q components of the signal and to generate an imbalance correction signal based at least in part on the signal I and Q components, wherein the imbalance correction signal compensates for a gain and phase imbalance caused by the mixer circuit.

8. The system of claim 7, wherein the imbalance correction signal comprises an imbalance correction I component and an imbalance correction Q component, wherein each of the imbalance correction I component and the imbalance correction Q component are linear combinations of the signal I and Q components.

9. The system of claim 8, wherein each of the imbalance correction I component and the imbalance correction Q component are linear combinations of the signal I and Q components based on real coefficients.

10. The system of claim 7, wherein the imbalance correction signal is based at least in part on a least squares approximation of the gain and phase imbalance caused by the mixer.

11. The system of claim 1, wherein the skew correction circuitry is additionally configured to receive the at least one time-delayed signal I component and the at least one time-delayed signal Q component, wherein the skew correction signal is based at least in part on the at least one time-delayed signal I component and the at least one time-delayed signal Q component.

12. The system of claim 11, wherein the skew correction signal comprises a skew correction I component and a skew correction Q component, wherein each of the skew correction I component and the skew correction Q component are linear combinations of the signal I component, the signal Q component, the at least one time-delayed signal I component, and the at least one time-delayed signal Q component.

13. The system of claim 12, wherein each of the skew correction I component and the skew correction Q component are the linear combinations of the signal I component, the signal Q component, the at least one time-delayed signal I component, and the at least one time-delayed signal Q component based on real coefficients.

14. The system of claim 1, wherein the skew correction signal is based at least in part on a least squares approximation of the gain and phase skew caused by the mixer.

15. A non-transitory machine readable medium comprising instructions that, when executed, cause a machine to:
receive an in-phase (I) component of a signal and a quadrature (Q) component of the signal;
receive at least one time-delayed I component of the signal and at least one time-delayed Q component of the signal;
receive at least one time-delayed I component of the signal and at least one time-delayed Q component of the signal;
generate a skew correction signal that compensates for a gain and phase skew introduced by a mixer that upconverts the signal, wherein the skew correction signal comprises a skew correction I component and a skew correction Q component that are each based on a linear combination of the signal I component, the signal Q component, the at least one time-delayed I component of the signal, and the at least one time-delayed Q component of the signal, and wherein the skew correction signal is based at least in part on a least squares approximation of the gain and phase skew caused by the mixer; and
generate a mixer predistortion signal that compensates for nonlinearities introduced by the mixer.

16. The non-transitory machine readable medium of claim 15, wherein the mixer predistortion signal compensates for memory effects introduced by the mixer.

17. The non-transitory machine readable medium of claim 15, wherein the instructions, when executed, further cause the machine to generate an imbalance correction signal that compensates for a gain and phase imbalance introduced by the mixer.

18. The non-transitory machine readable medium of claim 17, wherein the imbalance correction signal comprises an imbalance correction I component and an imbalance correction Q component that are each based on a linear combination of the signal I component and the signal Q component.

* * * * *